US012347815B2

(12) United States Patent
Koide et al.

(10) Patent No.: US 12,347,815 B2
(45) Date of Patent: Jul. 1, 2025

(54) DISPLAY DEVICE

(71) Applicant: Japan Display Inc., Tokyo (JP)

(72) Inventors: Gen Koide, Tokyo (JP); Yoshinori Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 485 days.

(21) Appl. No.: 17/948,745

(22) Filed: Sep. 20, 2022

(65) Prior Publication Data

US 2023/0017957 A1 Jan. 19, 2023

Related U.S. Application Data

(63) Continuation of application No. PCT/JP2021/007235, filed on Feb. 26, 2021.

(30) Foreign Application Priority Data

Mar. 23, 2020 (JP) ................................ 2020-051441

(51) Int. Cl.
*H01L 25/075* (2006.01)
*G09G 3/32* (2016.01)
*H10H 20/857* (2025.01)

(52) U.S. Cl.
CPC .......... *H01L 25/0753* (2013.01); *G09G 3/32* (2013.01); *H10H 20/857* (2025.01);
(Continued)

(58) Field of Classification Search
CPC . H01L 25/0753; H01L 25/167; H10H 20/857; G09G 2300/0426;
(Continued)

(56) References Cited

U.S. PATENT DOCUMENTS 7,411,344 B2 * 8/2008 Yamazaki ............ H10K 10/466
                                                    313/506
11,195,453 B2   12/2021 Morita et al.
(Continued)

FOREIGN PATENT DOCUMENTS

CN    107768409 A    3/2018
JP    2008-151901 A  7/2008
(Continued)

OTHER PUBLICATIONS

International Search Report issued in International Patent Application No. PCT/JP2021/007235 on May 11, 2021 and English translation of same. 6 pages.
(Continued)

*Primary Examiner* — Victor A Mandala
(74) *Attorney, Agent, or Firm* — K&L Gates LLP

(57) ABSTRACT

According to an aspect, a display device includes: a substrate; a plurality of pixels provided to the substrate; a light-emitting element and a transistor provided to each of the pixels; an insulating film covering the transistor; a mounting electrode provided on the insulating film and on which the light-emitting element is mounted; and an anode electrode facing at least a part of the mounting electrode and electrically coupled to the transistor. The insulating film has a first groove extending along at least one side of an outer periphery of the mounting electrode in plan view seen from a direction perpendicular to the substrate. The mounting electrode is coupled to the anode electrode in a linear part along an extending direction of the first groove at a bottom surface of the first groove.

13 Claims, 17 Drawing Sheets

(52) U.S. Cl.
CPC ............... *G09G 2300/0426* (2013.01); *G09G 2300/0819* (2013.01); *G09G 2300/0852* (2013.01)

(58) Field of Classification Search
CPC ... G09G 2300/0819; G09G 2300/0852; G09G 2310/0251; G09G 3/32; G09F 9/30
See application file for complete search history.

(56) References Cited

U.S. PATENT DOCUMENTS

| | | | |
|---|---|---|---|
| 12,096,662 B2* | 9/2024 | Lhee | H10K 59/1315 |
| 2007/0222380 A1* | 9/2007 | Yamazaki | H10H 29/142 |
| | | | 313/509 |
| 2008/0143664 A1 | 6/2008 | Nakagawa | |
| 2017/0076667 A1 | 3/2017 | Numata et al. | |
| 2018/0090068 A1* | 3/2018 | Ogawa | G09G 3/2074 |
| 2019/0073951 A1* | 3/2019 | Ogawa | G02F 1/1343 |
| 2019/0075633 A1 | 3/2019 | Tsai et al. | |
| 2019/0189974 A1* | 6/2019 | Gunji | H10K 59/1216 |
| 2020/0026119 A1* | 1/2020 | Imazeki | G09G 3/3648 |
| 2020/0251505 A1* | 8/2020 | Watakabe | G02F 1/1368 |
| 2020/0387038 A1* | 12/2020 | Itou | H10D 86/411 |
| 2021/0082892 A1 | 3/2021 | Kanaya et al. | |
| 2021/0398952 A1* | 12/2021 | Zhang | H10D 86/60 |
| 2022/0059026 A1 | 2/2022 | Morita et al. | |

FOREIGN PATENT DOCUMENTS

| | | |
|---|---|---|
| JP | 2017-054058 A | 3/2017 |
| JP | 2019-212694 A | 12/2019 |
| WO | WO2019/167405 A1 | 9/2019 |
| WO | WO2019/235147 A1 | 12/2019 |

OTHER PUBLICATIONS

Written Opinion issued in International Patent Application No. PCT/JP2021/007235 on May 11, 2021. 4 pages.

* cited by examiner

DISPLAY DEVICE

CROSS-REFERENCE TO RELATED APPLICATION

This application claims the benefit of priority from Japanese Patent Application No. 2020-051441 filed on Mar. 23, 2020 and International Patent Application No. PCT/JP2021/007235 filed on Feb. 26, 2021, the entire contents of which are incorporated herein by reference.

BACKGROUND

1. Technical Field

What is disclosed herein relates to a display device.

2. Description of the Related Art

Widely known are display devices provided with organic light-emitting diodes (OLEDs) or inorganic light-emitting diodes (micro-LEDs) as display elements. The specification of US Patent Application Publication No. 2019/0075633 and Japanese Patent Application Laid-open Publication No. 2019-212694 describe display devices in which a plurality of light-emitting elements are mounted on mounting electrodes of an array substrate.

In such display devices, the mounting electrodes for mounting the light-emitting elements may possibly peel off.

SUMMARY

According to an aspect, a display device includes: a substrate; a plurality of pixels provided to the substrate; a light-emitting element and a transistor provided to each of the pixels; an insulating film covering the transistor; a mounting electrode provided on the insulating film and on which the light-emitting element is mounted; and an anode electrode facing at least a part of the mounting electrode and electrically coupled to the transistor. The insulating film has a first groove extending along at least one side of an outer periphery of the mounting electrode in plan view seen from a direction perpendicular to the substrate. The mounting electrode is coupled to the anode electrode in a linear part along an extending direction of the first groove at a bottom surface of the first groove.

DETAILED DESCRIPTION

Figure 1:
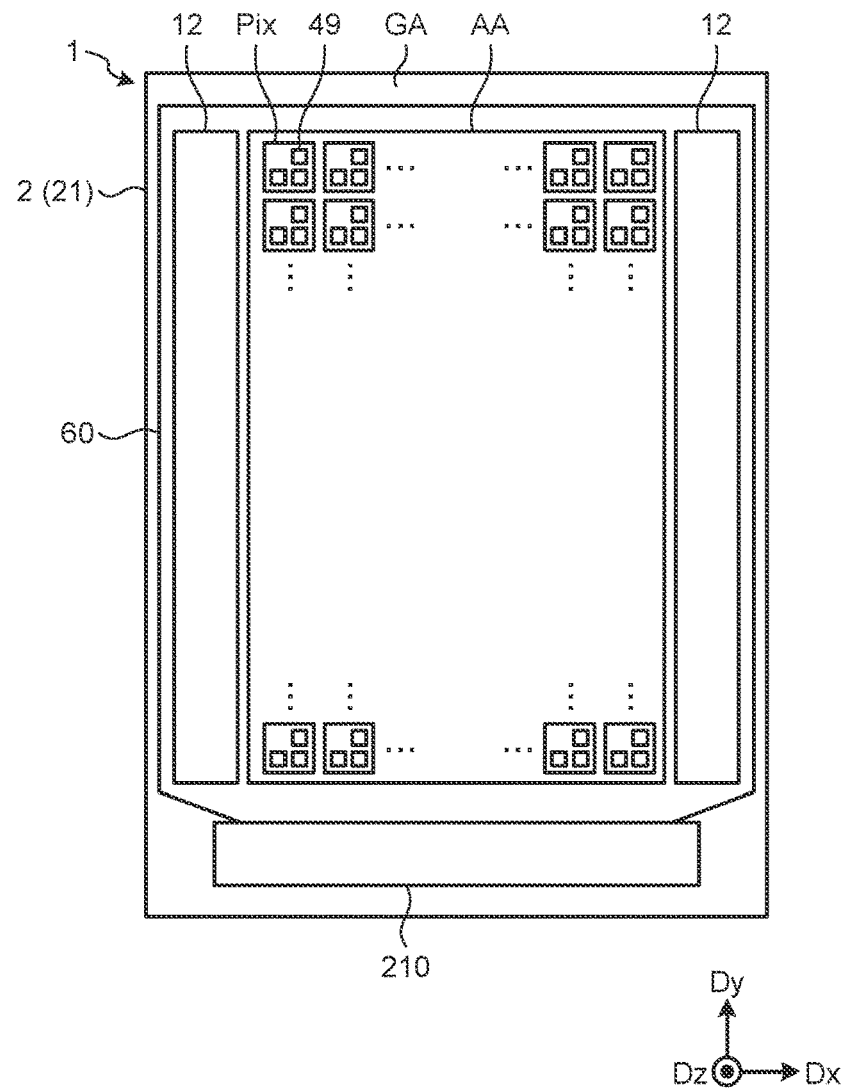
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

In this disclosure, when an element is described as being "on" another element, the element can be directly on the other element, or there can be one or more elements between the element and the other element.

First Embodiment

FIG. 1 is a plan view schematically illustrating a display device according to an embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board that drives the pixels Pix and is also called a backplane or an active matrix substrate. The array substrate 2 includes a substrate 21, a plurality of transistors, a plurality of capacitors, various kinds of wiring, and other components.

As illustrated in FIG. 1, the display device 1 has a display region AA and a peripheral region GA. The display region AA is arranged overlapping the pixels Pix and displays an image. The peripheral region GA does not overlap the pixels Pix and is positioned outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, plan view indicates the positional relation viewed from the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals from the drive IC 210. The drive circuits 12 sequentially or simultaneously select a plurality of gate lines and supply gate drive signals to the selected gate lines. As a result, the drive circuits 12 select the pixels Pix coupled to the gate lines.

The drive IC 210 is a circuit that controls display on the display device 1. The drive IC 210 is mounted on the peripheral region GA of the substrate 21 as a chip on glass (COG) driver. The configuration is not limited thereto, and the drive IC 210 may be mounted on a flexible printed circuit board or a rigid circuit board coupled to the peripheral region GA of the substrate 21 as a chip on film (COF) driver.

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light-emitting elements 3 are coupled to the cathode wiring 60 that is shared among the cathodes and are supplied with a fixed potential (e.g., a ground potential). More specifically, a cathode terminal 32 (refer to FIG. 5) of the light-emitting element 3 is coupled to the cathode wiring 60 via a cathode electrode 22.

Figure 2:
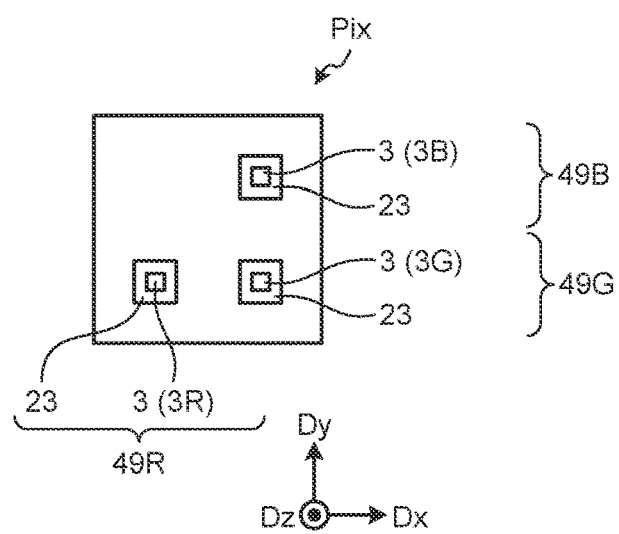
FIG. 2 is a plan view of a plurality of pixels.

FIG. 2 is a plan view of a plurality of pixels. As illustrated in FIG. 2, one pixel Pix includes a plurality of pixels 49. The pixel Pix includes a first pixel 49R, a second pixel 49G, and a third pixel 49B, for example. The first pixel 49R displays a primary color of red as the first color. The second pixel 49G displays a primary color of green as the second color. The third pixel 49B displays a primary color of blue as the third color. As illustrated in FIG. 2, the first pixel 49R and the second pixel 49G are adjacently disposed in the first direction Dx in one pixel Pix. The second pixel 49G and the third pixel 49B are adjacently disposed in the second direction Dy. The first color, the second color, and the third color are not limited to red, green, and blue, respectively, and may be any desired colors, such as complementary colors. In the following description, the first pixel 49R, the second pixel 49G, and the third pixel 49B are simply referred to as the pixels 49 when they need not be distinguished from one another.

Each pixel 49 includes the light-emitting element 3 and an anode electrode 23. The display device 1 displays an image by outputting different light beams from the light-emitting elements 3R, 3G, and 3B in the first pixel 49R, the second pixel 49G, and the third pixel 49B, respectively. The light-emitting element 3 is an inorganic light-emitting diode (LED) chip having a size of approximately 3 μm to 300 μm in plan view and is called a micro-LED. The display device 1 including micro-LEDs in respective pixels is also called a micro-LED display device. The term "micro" of the micro-LED is not intended to limit the size of the light-emitting element 3.

The light-emitting elements 3 may output different light beams in four or more colors. The arrangement of the pixels 49 is not limited to the configuration illustrated in FIG. 2. The first pixel 49R and the third pixel 49B, for example, may be adjacently disposed in the first direction Dx. The first pixel 49R, the second pixel 49G, and the third pixel 49B may be repeatedly arrayed in this order in the first direction Dx.

Figure 3:
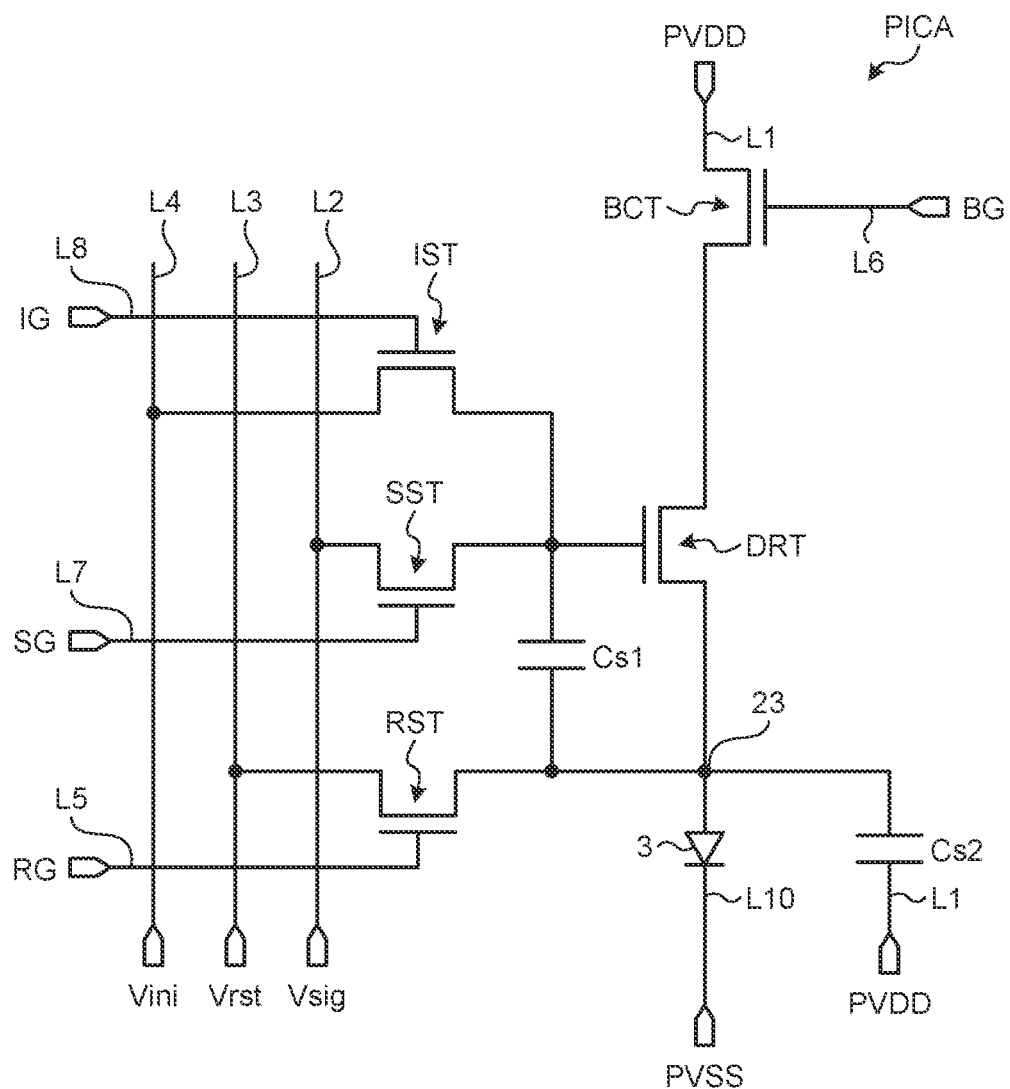
FIG. 3 is a circuit diagram of a pixel circuit.

FIG. 3 is a circuit diagram of a pixel circuit. FIG. 3 illustrates a pixel circuit PICA provided in one pixel 49, and the circuits PICA is provided in each of the pixels 49. As illustrated in FIG. 3, the pixel circuit PICA includes the light-emitting element 3, five transistors, and two capacitors. Specifically, the pixel circuit PICA includes a drive transistor DRT (transistor), an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitor Cs1 and second capacitor Cs2.

The cathode (cathode terminal 32) of the light-emitting element 3 is coupled to a cathode power supply line L10. The anode (anode terminal 33) of the light-emitting element 3 is coupled to an anode power supply line L1 via the drive transistor DRT and the output transistor BCT. The anode power supply line L1 is supplied with an anode power supply potential PVDD. The cathode power supply line L10 is supplied with a cathode power supply potential PVSS via the cathode wiring 60 and the cathode electrode 22. The anode power supply potential PVDD is higher than the cathode power supply potential PVSS.

The anode power supply line L1 supplies, to the pixel 49, the anode power supply potential PVDD serving as a drive potential. Specifically, the light-emitting element 3 ideally emits light by being supplied with a forward current (drive current) due to the potential difference between the anode power supply potential PVDD and the cathode power supply potential PVSS (PVDD-PVSS). In other words, the anode power supply potential PVDD has a potential difference for causing the light-emitting element 3 to emit light with respect to the cathode power supply potential PVSS. The anode terminal 33 of the light-emitting element 3 is electrically coupled to the anode electrode 23, and the second capacitor Cs2 is coupled between the anode electrode 23 and the anode power supply line L1 as an equivalent circuit.

The source electrode of the drive transistor DRT is coupled to the anode terminal 33 of the light-emitting element 3 via the anode electrode 23, and the drain electrode thereof is coupled to the source electrode of the output transistor BCT. The gate electrode of the drive transistor DRT is coupled to the first capacitor Cs1, the drain electrode of the pixel selection transistor SST, and the drain electrode of the initialization transistor IST.

The gate electrode of the output transistor BCT is coupled to the output control signal line L6. The output control signal line L6 is supplied with output control signals BG. The drain electrode of the output transistor BCT is coupled to the anode power supply line L1.

The source electrode of the initialization transistor IST is coupled to the initialization power supply line L4. The initialization power supply line L4 is supplied with an initialization potential Vini. The gate electrode of the initialization transistor IST is coupled to the initialization control signal line L8. The initialization control signal line L8 is supplied with initialization control signals IG. In other words, the gate electrode of the drive transistor DRT is coupled to the initialization power supply line L4 via the initialization transistor IST.

The source electrode of the pixel selection transistor SST is coupled to the video signal line L2. The video signal line L2 is supplied with video signals Vsig. The gate electrode of the pixel selection transistor SST is coupled to the pixel control signal line L7. The pixel control signal line L7 is supplied with pixel control signals SG.

The source electrode of the reset transistor RST is coupled to the reset power supply line L3. The reset power supply line L3 is supplied with a reset power supply potential Vrst. The gate electrode of the reset transistor RST is coupled to the reset control signal line L5. The reset control signal line L5 is supplied with reset control signals RG. The drain electrode of the reset transistor RST is coupled to the anode electrode 23 (anode terminal 33 of the light-emitting element 3) and the source electrode of the drive transistor DRT. A reset operation performed by the reset transistor RST resets the voltage held in the first capacitor Cs1 and the second capacitor Cs2.

The first capacitor Cs1 is provided as an equivalent circuit between the drain electrode of the reset transistor RST and the gate electrode of the drive transistor DRT. With the first capacitor Cs1 and the second capacitor Cs2, the pixel circuit PICA can reduce fluctuations in the gate voltage due to parasitic capacitance and leakage current in the drive transistor DRT.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or a gradation signal). In other words, the drive transistor DRT supplies an electric current corresponding to the video signal Vsig to the light-emitting element 3 based on the anode power supply potential PVDD supplied via the output transistor BCT. As described above, the anode power supply potential PVDD supplied to the anode power supply line L1 is lowered by the drive transistor DRT and the output transistor BCT. As a result, the anode terminal 33 of the light-emitting element 3 is supplied with an electric potential lower than the anode power supply potential PVDD.

A first electrode of the second capacitor Cs2 is supplied with the anode power supply potential PVDD via the anode power supply line L1, and a second electrode of the second capacitor Cs2 is supplied with an electric potential lower than the anode power supply potential PVDD. In other words, the first electrode of the second capacitor Cs2 is supplied with a higher potential than the second electrode of the second capacitor Cs2. For example, the first electrode of the second capacitor Cs2 is a counter electrode 26 coupled to the anode power supply line L1 illustrated in FIG. 5, and the second electrode of the second capacitor Cs2 is the anode electrode 23 coupled to the source of the drive transistor DRT illustrated in FIG. 5.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the pixels 49 of the selected pixel row, thereby causing the light-emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

Figure 4:
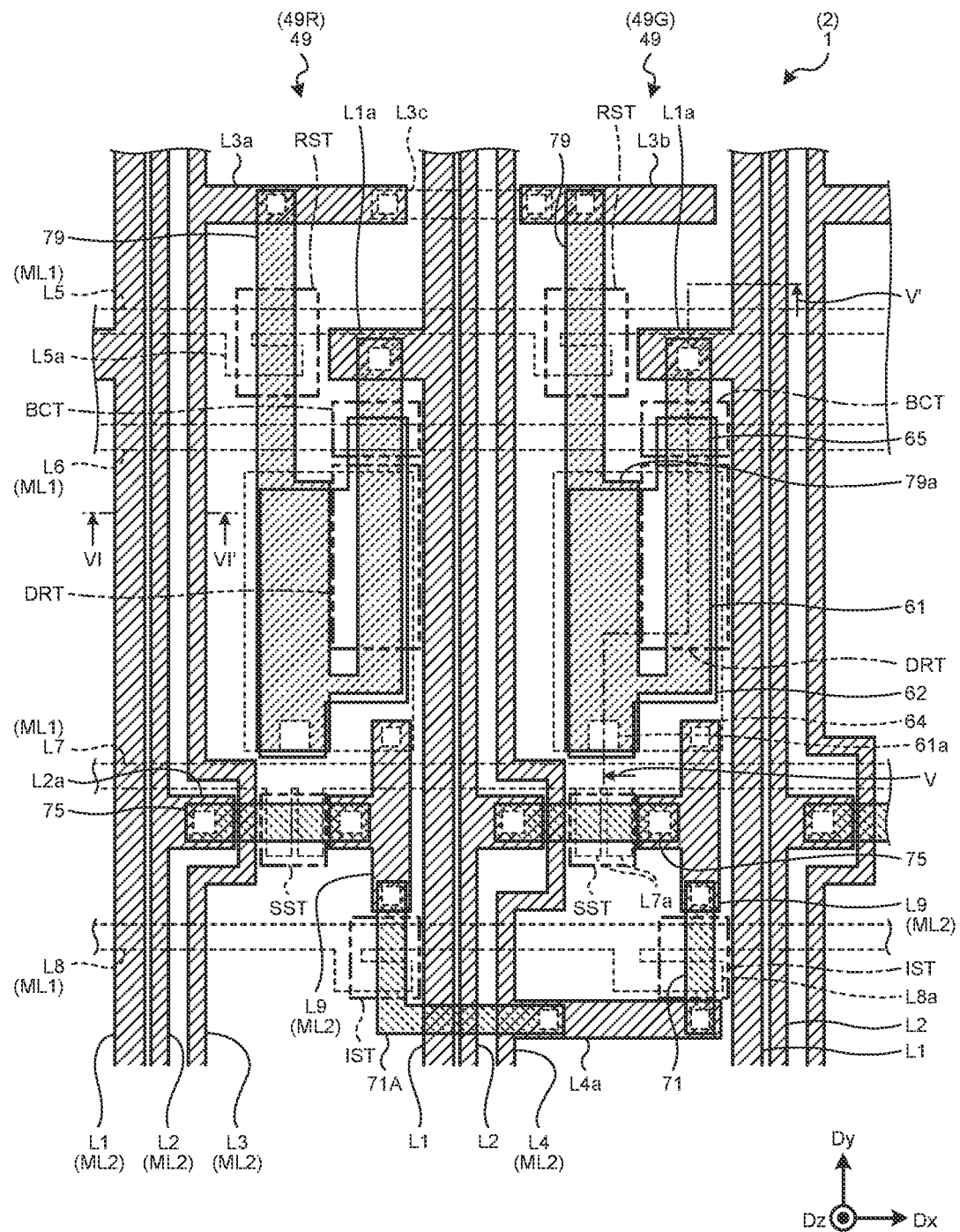
FIG. 4 is an enlarged plan view of two pixels of the display device according to the first embodiment.
Figure 5:
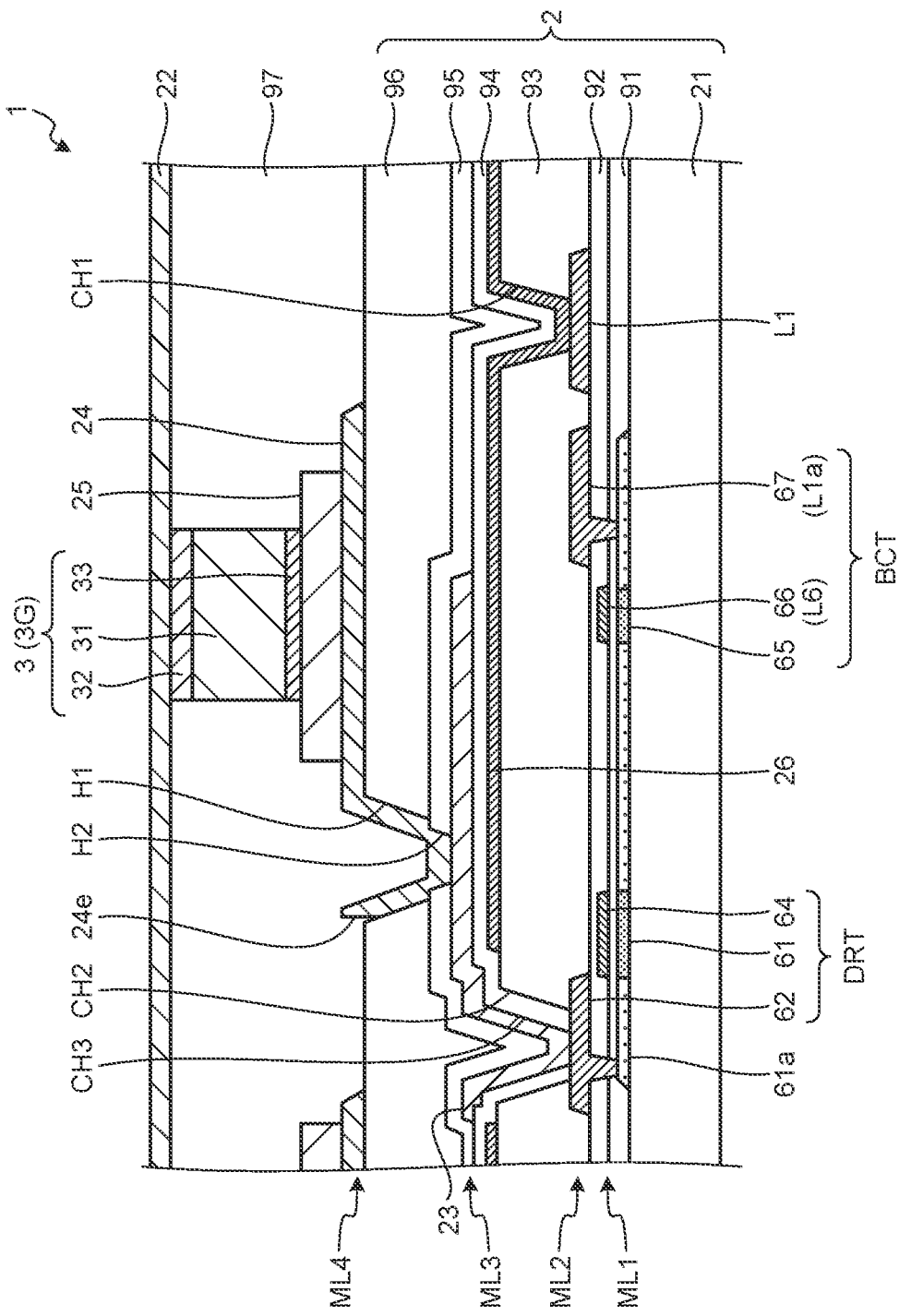
FIG. 5 is a sectional view along line V-V' of FIG. 4.
Figure 6:
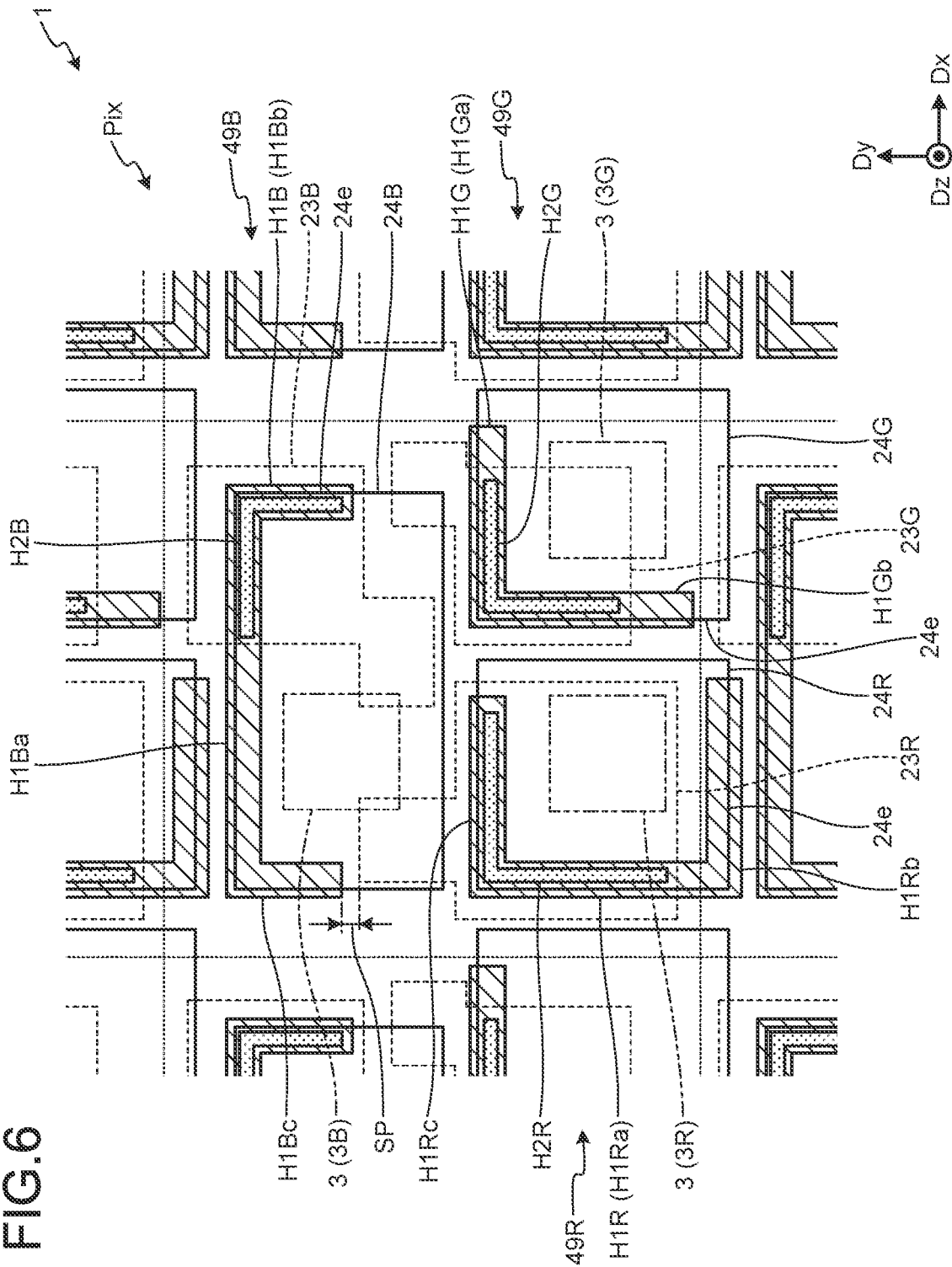
FIG. 6 is a plan view schematically illustrating the configuration of anode electrodes, mounting electrodes, first grooves, and second grooves according to the first embodiment.

The following describes a specific configuration example of the transistors and the wiring with reference to FIGS. 4 to 6. FIG. 4 is an enlarged plan view of two pixels of the display device according to the embodiment.

FIG. 4 illustrates two pixels 49 (e.g., the first pixel 49R and the second pixel 49G) adjacently disposed in the first direction Dx. As illustrated in FIG. 4, the anode power supply line L1, the video signal line L2, the reset power supply line L3, and the initialization power supply line L4 extend in the second direction Dy. The reset control signal line L5, the output control signal line L6, the pixel control signal line L7, and the initialization control signal line L8 extend in the first direction Dx and intersect the anode power supply line L1, the video signal line L2, the reset power supply line L3, and the initialization power supply line L4 in plan view. Coupling wiring L9 is provided between two anode power supply lines L1 adjacently disposed in the first direction Dx. The coupling wiring L9 couples the drive transistor DRT, the pixel selection transistor SST, and the initialization transistor IST.

The display device 1 (array substrate 2) according to the present embodiment includes a first metal layer ML1 and a second metal layer ML2 provided in different directions in the third direction Dz. FIG. 4 illustrates the configuration from the substrate 21 to the second metal layer ML2 in plan view. As illustrated in FIG. 5, the display device 1 also includes a third metal layer ML3 and a fourth metal layer ML4 besides the first metal layer ML1 and the second metal layer ML2. The third metal layer ML3 and the fourth metal layer ML4 will be described later.

The first metal layer ML1 and the second metal layer ML2 are provided in layers different from semiconductor layers 61, 65, 71, 75, and 79. In FIG. 4, the first metal layer ML1 is represented by the dotted lines, and the second metal layer ML2 and the semiconductor layers 61, 65, 71, 75, and 79 are hatched to distinguish the first metal layer ML1 from the second metal layer ML2 and the semiconductor layers 61, 65, 71, 75, and 79.

The anode power supply line L1, the video signal line L2, the reset power supply line L3, the initialization power supply line L4, and the coupling wiring L9 are formed with the second metal layer ML2. The reset control signal line L5, the output control signal line L6, the pixel control signal line L7, and the initialization control signal line L8 are formed with the first metal layer ML1.

The first metal layer ML1 and the second metal layer ML2 are made of titanium (Ti), molybdenum (Mo), tungsten (W), tantalum (Ta), niobium (Nb), indium tin oxide (ITO), aluminum (Al), silver (Ag), Ag alloy, copper (Cu), carbon nanotube, graphite, graphene, or carbon nanobud, for example. The sheet resistance of each of the anode power supply line L1, the video signal line L2, the reset power supply line L3, the initialization power supply line L4, and the coupling wiring L9 formed with the second metal layer ML2 is equal to or lower than those of the gate lines formed by the first metal layer ML1. The sheet resistance of the anode power supply line L1 is equal to or lower than those of the signal lines (the video signal line L2, the reset power supply line L3, the initialization power supply line L4, and the coupling wiring L9). With this configuration, the display device 1 can restrain voltage drop of a drive voltage applied to the anode power supply line L1, thereby restraining deterioration of display quality.

The first metal layer ML1 and the second metal layer ML2 are not each limited to a single layer and may be a multi-layered film. The second metal layer ML2, for example, may have a multilayered structure of Ti/Al/Ti or Mo/Al/Mo or may be a single-layered film made of Al. Ti, Al, and Mo may be alloys.

The semiconductor layers 61, 65, 71, and 75 are made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (ZnO), ITZO, etc. IGZO is indium gallium zinc oxide. ITZO is indium tin zinc oxide. The semiconductor layers 61, 65, 71, and 75 may made of the same material, such as polycrystalline silicon.

As illustrated in FIG. 4, the reset power supply line L3 and the initialization power supply line L4 are shared by the two pixels 49 adjacently disposed in the first direction Dx. Specifically, the first pixel 49R illustrated on the left in FIG. 4 is provided not with the initialization power supply line L4 but with the reset power supply line L3 along the video signal line L2. The second pixel 49G illustrated on the right in FIG. 4 is provided not with the reset power supply line L3 but with the initialization power supply line L4 along the video signal line L2. This configuration reduces the number of wiring lines and enables the wiring lines to be efficiently disposed as compared with a case where the reset power supply line L3 and the initialization power supply line L4 are provided for each of the pixels 49.

The drive transistor DRT (first transistor) includes the semiconductor layer 61, a source electrode 62, and a gate electrode 64. The semiconductor layer 61, the source electrode 62, and the gate electrode 64 partially overlap in plan view and are provided in the region surrounded by the two anode power supply lines L1 adjacently disposed in the first direction Dx, the output control signal line L6, and the pixel control signal line L7. The drive transistor DRT has a single-gate structure in which one gate electrode 64 is provided overlapping the semiconductor layer 61.

The semiconductor layer 61 is coupled to a first partial semiconductor layer 61a. The first partial semiconductor layer 61a is provided in the same layer and made of the same semiconductor material as that of the semiconductor layer 61. The semiconductor layer 61 is coupled to the source electrode 62 via the first partial semiconductor layer 61a. The first partial semiconductor layer 61a is provided adjacently to the semiconductor layer 61 in the first direction Dx. The first partial semiconductor layer 61a is provided overlapping an insulating film 91 (refer to FIG. 5) and the gate electrode 64, and the first capacitor Cs1 is formed between the first partial semiconductor layer 61a and the gate electrode 64. The semiconductor layer 61 and the first partial semiconductor layer 61a may be one rectangular semiconductor layer.

The output transistor BCT includes the semiconductor layer 65. The semiconductor layer 65 is coupled to the semiconductor layer 61 and intersects the output control signal line L6 in plan view. A channel region is formed in a region of the semiconductor layer 65 overlapping the output control signal line L6. A part of the output control signal line L6 overlapping the semiconductor layer 65 functions as a gate electrode 66 of the output transistor BCT. One end of the semiconductor layer 65 is electrically coupled to an anode power supply line coupling part L1a. The anode power supply line coupling part L1a is a part branched from the anode power supply line L1 in the first direction Dx. With this configuration, the drive transistor DRT and the output transistor BCT are supplied with the anode power supply potential PVDD from the anode power supply line L1.

In the second pixel 49G illustrated on the right in FIG. 4, the initialization transistor IST includes the semiconductor layer 71. In the first pixel 49R illustrated on the left in FIG. 4, the initialization transistor IST includes a semiconductor layer 71A. The semiconductor layers 71 and 71A intersect the initialization control signal line L8 and a branch signal line L8a in plan view. A channel region is formed in a region of the semiconductor layers 71 and 71A overlapping the initialization control signal line L8 and the branch signal line L8a. The branch signal line L8a is branched from the initialization control signal line L8 and extends in the first direction Dx. The parts of the initialization control signal line L8 and the branch signal line L8a overlapping the semiconductor layers 71 and 71A each function as a gate electrode of the initialization transistor IST. In other words, the initialization transistor IST has a double-gate structure in which two gate electrodes are provided overlapping each of the semiconductor layers 71 and 71A.

In the second pixel 49G illustrated on the right in FIG. 4, the semiconductor layer 71 extends in the second direction Dy and is electrically coupled to the coupling wiring L9 at one end and to an initialization power supply line coupling part L4a at the other end. The initialization power supply line coupling part L4a is a part branched from the initialization power supply line L4 in the first direction Dx. In the first pixel 49R illustrated on the left in FIG. 4, the semiconductor layer 71A has a part extending in the second direction Dy and a part extending in the first direction Dx. One end of a part of the semiconductor layer 71A extending in the second direction Dy is electrically coupled to the coupling wiring L9. A part of the semiconductor layer 71A extending in the first direction Dx intersects the anode power supply line L1 and the video signal line L2 in plan view, extends to the second pixel 49G, and is electrically coupled to the initialization power supply line coupling part L4a. With this configuration, one initialization power supply line L4 is electrically coupled to the two initialization transistors IST and is shared by the two pixels 49 adjacently disposed in the first direction Dx.

The pixel selection transistor SST includes the semiconductor layer 75. The semiconductor layer 75 extends in the first direction Dx and intersects two branch signal lines L7a in plan view. A channel region is formed in a region of the semiconductor layer 75 overlapping the two branch signal lines L7a. The two branch signal lines L7a are parts branched from the pixel control signal line L7 in the second direction Dy. The parts of the two branch signal lines L7a overlapping the semiconductor layer 75 each function as a gate electrode of the pixel selection transistor SST. In other words, the pixel selection transistor SST has a double-gate structure in which two gate electrodes are provided overlapping the semiconductor layer 75. One end of the semiconductor layer 75 is coupled to a video signal line coupling part L2a, and the other end is coupled to the coupling wiring L9. The video signal line coupling part L2a is a part branched from the video signal line L2 in the first direction Dx.

The reset transistor RST includes the semiconductor layer 79. The semiconductor layer 79 extends in the second direction Dy and intersects the reset control signal line L5 and a branch signal line L5a in plan view. A channel region is formed in a region of the semiconductor layer 79 overlapping the reset control signal line L5 and the branch signal line L5a. The branch signal line L5a is branched from the reset control signal line L5 and extends in the first direction Dx. The parts of the reset control signal line L5 and the branch signal line L5a overlapping the semiconductor layer 79 each function as a gate electrode of the reset transistor RST. In other words, the reset transistor RST has a double-gate structure.

The reset power supply line L3 is coupled to reset power supply line coupling parts L3a and L3b and a bridge L3c extending in the first direction Dx. The reset power supply line coupling parts L3a and L3b are formed by the second metal layer ML2. The bridge L3c is formed by a layer different from that of the reset power supply line coupling parts L3a and L3b, that is, the first metal layer ML1, for example. The reset power supply line coupling part L3a is provided to the first pixel 49R, and the reset power supply line coupling part L3b is provided to the second pixel 49G. The anode power supply line L1, the video signal line L2, and the initialization power supply line L4 are provided between the reset power supply line coupling parts L3a and L3b. The bridge L3c intersects the anode power supply line L1, the video signal line L2, and the initialization power supply line L4 in plan view and couples the reset power supply line coupling parts L3a and L3b.

In the first pixel 49R, one end of the semiconductor layer 79 is coupled to the reset power supply line coupling part L3a. In the second pixel 49G, one end of the semiconductor layer 79 is coupled to the reset power supply line coupling part L3b. The other ends of the semiconductor layers 79 are each electrically coupled to the semiconductor layer 61 via the first partial semiconductor layer 61a. In other words, the other end of the semiconductor layer 79 of the reset transistor RST is electrically coupled to the anode terminal 33 of the light-emitting element 3 via the semiconductor layer 61 and the source electrode 62. With this configuration, one reset power supply line L3 is electrically coupled to the two reset transistors RST and is shared by the two pixels 49 adjacently disposed in the first direction Dx.

The drive transistor DRT and the output transistor BCT that supply the drive current to the light-emitting element 3 according to the present embodiment have a single-gate structure. The initialization transistor IST, the pixel selection transistor SST, and the reset transistor RST have a double-gate structure. This configuration can reduce leakage current in the initialization transistor IST, the pixel selection transistor SST, and the reset transistor RST.

The following describes a sectional configuration of the display device 1. FIG. 5 is a sectional view along line V-V' of FIG. 4. As illustrated in FIG. 5, the light-emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light-emitting element 3 in a direction perpendicular to the surface of the substrate 21 is referred to as an "upper side" or simply as "on" or "above". A direction from the light-emitting element 3 toward the substrate 21 is referred to as a "lower side" or simply as "beneath" or "below".

The drive transistor DRT and the output transistor BCT are provided on a first surface of the substrate 21. The semiconductor layers 61 and 65 are provided on the substrate 21. An undercoat film may be provided between the semiconductor layers 61 and 65 and the substrate 21. An insulating film 91 is provided on the substrate 21 to cover the semiconductor layers 61 and 65. The insulating film 91 is a silicon oxide film, for example.

The gate electrodes 64 and 66 are provided on the upper side of the insulating film 91. The gate electrodes 64 and 66 are formed with the first metal layer ML1. In the example illustrated in FIG. 5, the transistors have what is called a top-gate structure. The transistors may have a bottom-gate structure in which the gate electrode is provided on the lower side of the semiconductor layer or a dual-gate structure in which the gate electrodes are provided on the upper side and lower side of the semiconductor layer.

An insulating film 92 is provided on the insulating film 91 to cover the gate electrodes 64 and 66. The insulating film 92 has a multilayered structure composed of a silicon nitride film and a silicon oxide film, for example. The source electrode 62, a drain electrode 67, and the anode power supply line L1 are provided on the insulating film 92. The source electrode 62, the drain electrode 67, and the anode power supply line L1 are formed with the second metal layer ML2. The source electrode 62 is electrically coupled to the first partial semiconductor layer 61a (semiconductor layer 61) through a contact hole passing through the insulating films 91 and 92. The drain electrode 67 is electrically coupled to the semiconductor layer 65 through a contact hole formed in the insulating films 91 and 92.

A plurality of insulating films (a first organic insulating film 93, an insulating film 94, an insulating film 95, and a second organic insulating film 96) are provided covering the transistors. The first organic insulating film 93 and the second organic insulating film 96 are made of organic material, such as photosensitive acrylic. The organic material, such as photosensitive acrylic, is excellent in coverability for covering a difference in level of wiring and flatness on the surface as compared with inorganic insulating material formed by chemical vapor deposition (CVD), for example. The insulating films 94 and 95 are inorganic insulating films and can be made of the same material as that of the insulating films 91 and 92, such as a silicon nitride film.

Specifically, the first organic insulating film 93 is provided on the insulating film 92 to cover the source electrode 62, the drain electrode 67, and the anode power supply line L1. The counter electrode 26, the insulating film 94, and the anode electrode 23 are stacked in this order on the first organic insulating film 93. The counter electrode 26 is made of light-transmitting conductive material, such as indium tin oxide (ITO). The counter electrode 26 is coupled to the anode power supply line L1 at the bottom of a contact hole CH1 formed in the first organic insulating film 93.

The insulating film 94 is provided covering the counter electrode 26. The anode electrode 23 faces the counter electrode 26 with the insulating film 94 interposed therebetween. Contact holes CH2 and CH3 each having a bottom surface corresponding to the source electrode 62, are provided in the first organic insulating film 93 and the insulating film 94. The anode electrode 23 is electrically coupled to the source electrode 62 through the contact holes CH2 and CH3. As a result, the anode electrode 23 is electrically coupled to the drive transistor DRT.

The anode electrode 23 is formed with the third metal layer ML3 and has a multilayered structure of titanium (Ti) and aluminum (Al), for example. The embodiment is not limited thereto, and the anode electrode 23 may be made of material including at least one of metals of molybdenum (Mo) and Ti. Alternatively, the anode electrode 23 may be made of alloy including at least one of Mo and Ti or light-transmitting conductive material. The second capacitor Cs2 is formed between the anode electrode 23 and the counter electrode 26 facing each other with the insulating film 94 interposed therebetween.

The insulating film 95 is provided on the insulating film 94 to cover the anode electrode 23. The second organic insulating film 96 is provided on the insulating film 95. In other words, the first organic insulating film 93 is provided on the drive transistor DRT, and the second organic insulating film 96 is stacked on the upper side of the first organic insulating film 93. The insulating film 95 is provided between the first organic insulating film 93 and the second organic insulating film 96. A first groove H1 is formed in the second organic insulating film 96. A second groove H2 is formed in the insulating film 95 in a manner overlapping the first groove H1. The anode electrode 23 is provided at the bottoms of the first groove H1 and the second groove H2. The anode electrode 23 is provided facing at least a part of a mounting electrode 24.

The mounting electrode 24 is provided on the second organic insulating film 96 and is electrically coupled to the anode electrode 23 through the first groove H1 and the second groove H2. The mounting electrode 24 is formed by the fourth metal layer ML4 and has a multilayered structure of Ti and Al like the anode electrode 23. The mounting electrode 24 may be made of conductive material different from that of the anode electrode 23. The second organic insulating film 96 may be made of organic material different from that of the first organic insulating film 93.

The light-emitting elements 3R, 3G, and 3B are mounted on the respective mounting electrodes 24. Each light-emitting element 3 is mounted with the anode terminal 33 in contact with the mounting electrode 24. A bonding member 25 between the anode terminal 33 of the light-emitting element 3 and the mounting electrode 24 is not particularly limited as long as it can secure satisfactory electrical continuity between them and does not damage the objects formed on the array substrate 2. The bonding member 25 is made of solder or conductive paste, for example. Examples of the method for bonding the anode terminal 33 and the mounting electrode 24 include, but are not limited to, a process of ref lowing using low-temperature melting soldering material, a method of placing the light-emitting element 3 on the array substrate 2 with conductive paste interposed therebetween and sintering them, etc.

The light-emitting element 3 may be directly mounted on the anode electrode 23 without providing the second organic insulating film 96 or the mounting electrode 24 on the array substrate 2. By providing the second organic insulating film 96 and the mounting electrode 24, the insulating film 94 can be restrained from being damaged by force applied when mounting the light-emitting element 3. In other words, this configuration can hamper dielectric breakdown that would be caused between the anode electrode 23 and the counter electrode 26 that form the second capacitor Cs2.

The light-emitting element 3 includes a semiconductor layer 31, the cathode terminal 32, and the anode terminal 33.

The semiconductor layer 31 may have a configuration in which an n-type cladding layer, an active layer, and a p-type cladding layer are stacked. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the light-emitting elements 3R, 3G, and 3B. The active layer may have a multi-quantum well structure (MQW structure) in which well layers and barrier layers composed of several atomic layers are cyclically stacked for high efficiency. The light-emitting element 3 may have a configuration in which the semiconductor layer 31 is formed on a semiconductor substrate.

An element insulating film 97 is provided between the light-emitting elements 3. The element insulating film 97 is made of resin material. The element insulating film 97 covers the side surfaces of the light-emitting elements 3, and the cathode terminals 32 of the light-emitting elements 3 are exposed from the element insulating film 97. The element insulating film 97 is formed flat such that the upper surface of the element insulating film 97 and the upper surfaces of the cathode terminals 32 form the same plane. The position of the upper surface of the element insulating film 97 may be different from that of the upper surfaces of the cathode terminals 32.

The cathode electrode 22 covers the light-emitting elements 3 and the element insulating film 97 and is electrically coupled to the light-emitting elements 3. The cathode electrode 22 is made of light-transmitting conductive material, such as ITO. Therefore, the cathode electrode 22 can efficiently extract light emitted from the light-emitting elements 3 to the outside. The cathode electrode 22 is electrically coupled to the cathode terminals 32 of the light-emitting elements 3 mounted on the display region AA. The cathode electrode 22 is coupled to the cathode wiring 60 provided on the array substrate 2 at a contact part provided outside the display region AA.

As described above, the display device 1 provided with the light-emitting elements 3 as the display elements is configured. The display device 1 may include an overcoat layer or a cover substrate stacked on the cathode electrode 22 as necessary. The display device 1 may further include a circularly polarizing plate, a touch panel, and other components on the upper side of the cathode electrode 22. In the display device 1, the light-emitting element 3 does not necessarily have a face-up structure in which the upper part of the light-emitting element 3 is coupled to the cathode electrode 22. Alternatively, the light-emitting element 3 may have what is called a face-down structure in which the lower part of the light-emitting element 3 is coupled to the anode electrode 23 and the cathode electrode 22.

The following describes the configuration of the first groove H1 and the second groove H2 in plan view. FIG. 6 is a plan view schematically illustrating the configuration of the anode electrodes, the mounting electrodes, the first grooves, and the second grooves according to the first embodiment. In FIG. 6, the first grooves H1 and the second grooves H2 are hatched to make the drawing easy to see. The anode electrodes 23 are represented by dotted lines, and the light-emitting elements 3 are represented by alternate long and two short dashes lines.

As illustrated in FIG. 6, the first groove H1 extends along at least one side of an outer periphery 24e of the mounting electrode 24 in plan view seen from a direction perpendicular to the substrate 21. Specifically, the first pixel 49R, the second pixel 49G, and the third pixel 49B are provided with anode electrodes 23R, 23G, and 23B and mounting electrodes 24R, 24G, and 24B, respectively. In the following description, the anode electrodes 23R, 23G, and 23B are simply referred to as the anode electrodes 23 when they need not be distinguished from one another. The mounting electrodes 24R, 24G, and 24B are simply referred to as the mounting electrodes 24 when they need not be distinguished from one another.

The outer shapes of the anode electrodes 23R, 23G, and 23B are different from those of the mounting electrodes 24R, 24G, and 24B in plan view. In other words, the mounting electrodes 24R, 24G, and 24B each have a part overlapping a corresponding one of the anode electrodes 23R, 23G, and 23B and a part not overlapping the corresponding one of the anode electrodes 23R, 23G, and 23B.

In the first pixel 49R, a first groove H1R formed in the second organic insulating film 96 (refer to FIG. 5) has a first extending part H1Ra, a second extending part H1Rb, and a third extending part H1Rc. The first extending part H1Ra, the second extending part H1Rb, and the third extending part H1Rc are formed along three sides of the outer periphery 24e of the mounting electrode 24R.

The first extending part H1Ra extends in the second direction Dy along one side of the outer periphery 24e of the mounting electrode 24R. The first extending part H1Ra is composed of a part overlapping the anode electrode 23R and a part not overlapping the anode electrode 23R that are continuously formed.

The second extending part H1Rb is coupled to one end of the first extending part H1Ra and extends in the first direction Dx along one side of the outer periphery 24e of the mounting electrode 24R. The second extending part H1Rb does not overlap the anode electrode 23R.

The third extending part H1Rc is coupled to the other end of the first extending part H1Ra and extends in the first direction Dx along one side of the outer periphery 24e of the mounting electrode 24R. The third extending part H1Rc overlaps the anode electrode 23R. Thus, the first groove H1R is formed into substantially a C-shape in plan view by connecting the first extending part H1Ra, the second extending part H1Rb, and the third extending part H1Rc.

The second groove H2R formed in the insulating film 95 (refer to FIG. 5) overlaps the first groove H1R and extends in the same direction as that of the first groove H1R. Specifically, the second groove H2R is formed in a region overlapping the anode electrode 23R and has a part overlapping the first extending part H1Ra and extending in the second direction Dy and a part overlapping the third extending part H1Rc and extending in the first direction Dx. The second groove H2R is formed into an L-shape in plan view. The length of each extending part of the second groove H2R is shorter than the length of each extending part of the first groove H1R. In addition, the width of each extending part of the second groove H2R is shorter than the width of each extending part of the first groove H1R. The second groove H2R is not formed in a region of the insulating film 95 not overlapping the anode electrode 23R. Specifically, the second groove H2R is formed neither in a part of the first extending part H1Ra not overlapping the anode electrode 23R nor in the second extending part H1Rb.

In the region overlapping the anode electrode 23R, the mounting electrode 24R is coupled to the anode electrode 23R through the first groove H1R and the second groove H2R in a linear part along the extending direction of the first groove H1R and the second groove H2R. As a result, the light-emitting element 3R mounted on the mounting electrode 24R is electrically coupled to the drive transistor DRT through the first groove H1R and the second groove H2R. The outer periphery 24e of the mounting electrode 24R is provided overlapping the inner wall of the first groove H1R. More specifically, the outer periphery 24e is provided between the first groove H1R and the second groove H2R such that the mounting electrode 24R covers at least the bottom surface of the second groove H2R.

In the region not overlapping the anode electrode 23R, the mounting electrode 24R is formed along the inner wall of the first groove H1R and is in contact with the insulating film 95 at the bottom surface of the first groove H1R. In other words, on the outer periphery 24e of the mounting electrode 24R, the mounting electrode 24R is in contact with the anode electrode 23R at the bottom surfaces of the first groove H1R and the second groove H2R or in contact with the insulating film 95 at the bottom surface of the first groove H1R.

This configuration can secure the flatness of the mounting electrode 24R in the region on which the light-emitting element 3R is mounted and increase the adhesion strength on the three sides of the outer periphery 24e of the mounting electrode 24R. Compared with a case where the outer periphery 24e of the mounting electrode 24R is formed on the second organic insulating film 96, this configuration can restrain the mounting electrode 24R from peeling off from the outer periphery 24e because the outer periphery 24e of the mounting electrode 24R is disposed in the first groove H1.

If the bonding member 25, such as solder, flows when mounting the light-emitting element 3R, the bonding member 25 is accumulated in the first groove H1R because the first groove H1R is formed along the three sides of the outer periphery 24e of the mounting electrode 24R. As a result, a short circuit between the adjacent pixels 49 can be restrained.

Similarly, in the second pixel 49G, a first groove H1G formed in the second organic insulating film 96 (refer to FIG. 5) has a first extending part H1Ga and a second extending part H1Gb. The first extending part H1Ga and the second extending part H1Gb are formed along two sides of the outer periphery 24e of the mounting electrode 24G.

The first extending part H1Ga extends in the first direction Dx along one side of the outer periphery 24e of the mounting electrode 24G. The first extending part H1Ga is composed of a part overlapping the anode electrode 23G and a part not overlapping the anode electrode 23G that are continuously formed.

The second extending part H1Gb is coupled to one end of the first extending part H1Ga and extends in the second direction Dy along one side of the outer periphery 24e of the mounting electrode 24G. The second extending part H1Gb is composed of a part overlapping the anode electrode 23G and a part not overlapping the anode electrode 23G that are continuously formed. Thus, the first groove H1G is formed into substantially an L-shape in plan view by connecting the first extending part H1Ga and the second extending part H1Gb.

The second groove H2G formed in the insulating film 95 (refer to FIG. 5) overlaps the first groove H1G and extends in the same direction as that of the first groove H1G. Specifically, the second groove H2G is formed in a region overlapping the anode electrode 23G and has a part overlapping the first extending part H1Ga and extending in the first direction Dx and a part overlapping the second extending part H1Gb and extending in the second direction Dy. The second groove H2G is formed into an L-shape in plan view. The length of each extending part of the second groove H2G is shorter than the length of each extending part of the first groove H1G. In addition, the width of each extending part of the second groove H2G is shorter than the width of each extending part of the first groove H1G. The second groove H2G is not formed in a part of the first extending part H1Ga and a part of the second extending part H1Gb that do not overlap the anode electrode 23R.

With this configuration, the mounting electrode 24G is coupled to the anode electrode 23G through the first groove H1G and the second groove H2G in a linear part along the extending direction of the first groove H1G and the second groove H2G. As a result, the light-emitting element 3G mounted on the mounting electrode 24G is electrically coupled to the drive transistor DRT through the first groove H1G and the second groove H2G.

In the regions of the first extending part H1Ga and the second extending part H1Gb that do not overlap the anode electrode 23G, the mounting electrode 24G is formed along the inner wall of the first groove H1G and is in contact with the insulating film 95 at the bottom surface of the first groove H1G. In other words, on the outer periphery 24e of the mounting electrode 24G, the mounting electrode 24G is in contact with the anode electrode 23R at the bottom surfaces of the first groove H1G and the second groove H2G or in contact with the insulating film 95 at the bottom surface of the first groove H1G. This configuration can also increase the adhesion strength on at least two sides of the outer periphery 24e of the mounting electrode 24G in the second pixel 49G.

The first groove H1G is formed so as not to overlap the anode electrode 23 of the adjacent pixel Pix. In the example illustrated in FIG. 6, for example, the length of the second extending part H1Gb of the second pixel 49G is made shorter than the length of the first extending part H1Ra of the first pixel 49R. This configuration can secure electrical insulation between the mounting electrode 24G and the anode electrode 23 of the adjacent pixels Pix via the first groove H1G.

In the third pixel 49B, a first groove H1B formed in the second organic insulating film 96 (refer to FIG. 5) has a first extending part H1Ba, a second extending part H1Bb, and a third extending part H1Bc. The first extending part H1Ba, the second extending part H1Bb, and the third extending part H1Bc are formed along three sides of the outer periphery 24e of the mounting electrode 24B.

The first extending part H1Ba extends in the first direction Dx along one side of the outer periphery 24e of the mounting electrode 24B. The first extending part H1Ba is composed of a part overlapping the anode electrode 23B and a part not overlapping the anode electrode 23B that are continuously formed.

The second extending part H1Bb is coupled to one end of the first extending part H1Ba and extends in the second direction Dy along one side of the outer periphery 24e of the mounting electrode 24B. The second extending part H1Bb overlaps the anode electrode 23B.

The third extending part H1Bc is coupled to the other end of the first extending part H1Ba and extends in the second direction Dy along one side of the outer periphery 24e of the mounting electrode 24B. The third extending part H1Bc does not overlap the anode electrode 23B. Thus, the first groove H1B is formed into substantially a C-shape by connecting the first extending part H1Ba, the second extending part H1Bb, and the third extending part H1Bc.

The mounting electrode 24B overlaps parts of the anode electrodes 23 of the adjacent first pixel 49R and the adjacent second pixel 49G. The third extending part H1Bc is disposed at a distance from the anode electrode 23R of the adjacent first pixel 49R in plan view with a space SP interposed therebetween and is provided not overlapping the anode electrode 23R. Similarly, the second extending part H1Bb is provided not overlapping the anode electrode 23G of the adjacent second pixel 49G. This configuration increases the distance in the third direction Dz between the electrodes of the adjacent pixels 49 (e.g., the mounting electrode 24B of the third pixel 49B and the anode electrode 23G of the second pixel 49G) as compared with a case where the first groove H1 is formed overlapping the anode electrode 23 of the adjacent pixel 49. Therefore, capacitor formed between the anodes of the adjacent pixels 49 can be reduced.

The second groove H2B formed in the insulating film 95 (refer to FIG. 5) overlaps the first groove H1B and extends in the same direction as that of the first groove H1B. Specifically, the second groove H2B is formed in a region overlapping the anode electrode 23B and has a part overlapping the first extending part H1Ba and extending in the first direction Dx and a part overlapping the second extending part H1Bb and extending in the second direction Dy. The second groove H2B is formed into an L-shape in plan view. The length of each extending part of the second groove H2B is shorter than the length of each extending part of the first groove H1B. In addition, the width of each extending part of the second groove H2B is shorter than the width of each extending part of the first groove H1B. The second groove H2B is formed neither in a part of the first extending part H1Ba not overlapping the anode electrode 23B nor in the third extending part H1Bc.

With this configuration, the mounting electrode 24B is coupled to the anode electrode 23B through the first groove H1B and the second groove H2B in a linear part along the extending direction of the first groove H1B and the second groove H2B. As a result, the light-emitting element 3B mounted on the mounting electrode 24B is electrically coupled to the drive transistor DRT through the first groove H1B and the second groove H2B. This configuration can also increase the adhesion strength on the three sides of the outer periphery 24e of the mounting electrode 24B in the third pixel 49B.

The shapes and the positions of the first grooves H1 and the second grooves H2 of the pixels 49 illustrated in FIG. 6 are given by way of example only and can be appropriately modified depending on the arrangement relation between the mounting electrodes 24 and the anode electrodes 23 and other factors. The first groove H1 and the second groove H2, for example, may be formed as one linear groove along at least one side of the outer periphery 24e of the mounting electrode 24. While the mounting electrode 24 has a quadrilateral shape, the configuration is not limited thereto. The mounting electrode 24 may have a polygonal or irregular shape, and at least a part of the outer periphery 24e may be curved. In this case, the first groove H1 and the second groove H2 can be formed into a bent or curved shape along the outer periphery 24e of the mounting electrode 24.

First Modification of First Embodiment

Figure 7:
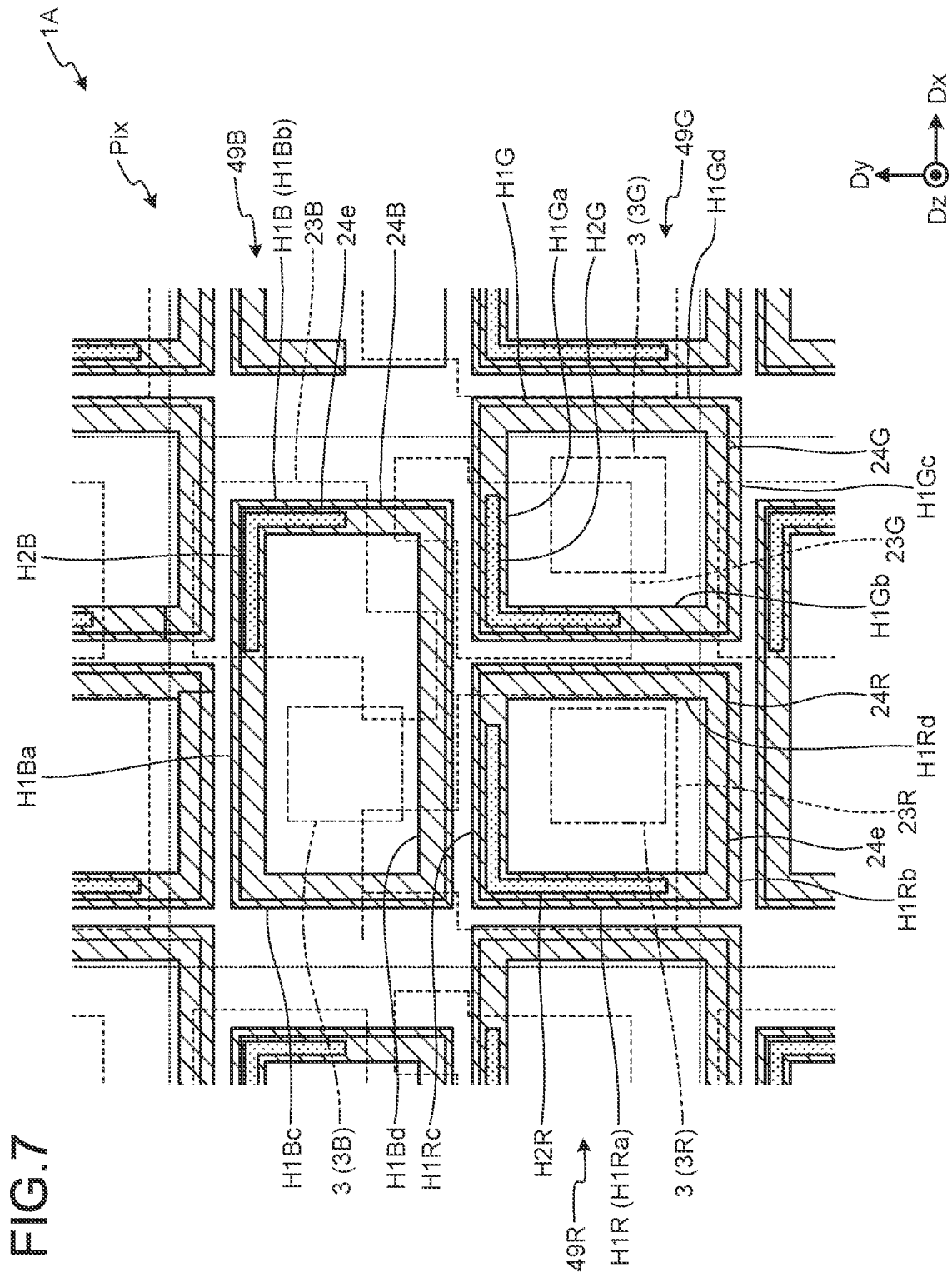
FIG. 7 is a plan view schematically illustrating the configuration of the anode electrodes, the mounting electrodes, the first grooves, and the second grooves according to a first modification of the first embodiment.

FIG. 7 is a plan view schematically illustrating the configuration of the anode electrodes, the mounting electrodes, the first grooves, and the second grooves according to a first modification of the first embodiment. As illustrated in FIG. 7, the first groove H1 of a display device 1A according to the first modification is formed into an annular shape along the outer periphery 24e of the mounting electrode 24.

In the first pixel 49R, the first groove H1R formed in the second organic insulating film 96 (refer to FIG. 5) has the first extending part H1Ra, the second extending part H1Rb, the third extending part H1Rc, and a fourth extending part H1Rd. The fourth extending part H1Rd extends in the second direction Dy along one side of the outer periphery 24e of the mounting electrode 24R and couples the end of the second extending part H1Rb to the end of the third extending part H1Rc.

The first extending part H1Ra, the second extending part H1Rb, the third extending part H1Rc, and the fourth extending part H1Rd are coupled in an annular shape and are formed along the four sides of the outer periphery 24e of the mounting electrode 24R. The second groove H2R is the same as that according to the first embodiment and is not formed in the fourth extending part H1Rd that does not overlap the anode electrode 23R.

Similarly, in the second pixel 49G, the first groove H1G has the first extending part H1Ga, the second extending part H1Gb, a third extending part H1Gc, and a fourth extending part H1Gd coupled in an annular shape and formed along the four sides of the outer periphery 24e of the mounting electrode 24G. In the third pixel 49B, the first groove H1B has the first extending part H1Ba, the second extending part H1Bb, the third extending part H1Bc, and a fourth extending part H1Bd coupled in an annular shape and formed along the four sides of the outer periphery 24e of the mounting electrode 24B.

With this configuration, the mounting electrode 24 according to the first modification is in contact with the anode electrode 23 at the bottom surfaces of the first groove H1 and the second groove H2 in the region overlapping the anode electrode 23 and in contact with the insulating film 95 at the bottom surface of the first groove H1 in the region not overlapping the anode electrode 23. This configuration can increase the adhesion strength on the four sides of the outer periphery 24e of the mounting electrode 24.

In the third pixel 49B, for example, both ends of the fourth extending part H1Bd of the first groove H1B overlap a part of the anode electrode 23R of the adjacent first pixel 49R and a part of the anode electrode 23G of the adjacent second pixel 49G. Also in this case, electrical insulation between the anode electrodes 23R and 23G and the mounting electrode 24B of the third pixel 49B can be secured because the insulating film 95 is provided covering the anode electrodes 23 of the pixels 49.

Second Embodiment

Figure 8:
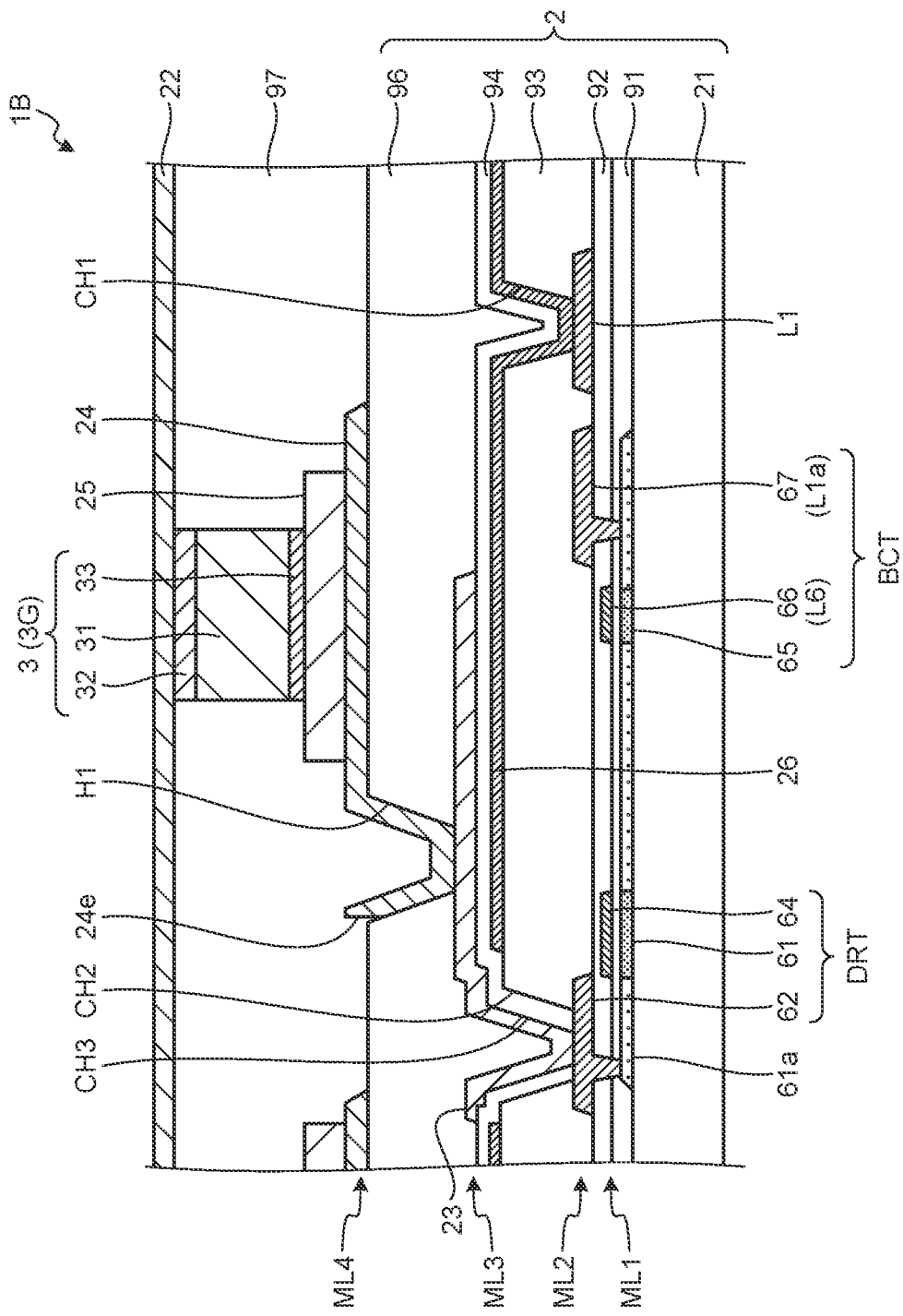
FIG. 8 is a sectional view schematically illustrating the display device according to a second embodiment.

FIG. 8 is a sectional view schematically illustrating the display device according to a second embodiment. A display device 1B according to the second embodiment is different from the first embodiment and the first modification in that neither the insulating film 95 nor the second groove H2 is provided.

As illustrated in FIG. 8, the insulating film 95 is not provided on the anode electrode 23 and the insulating film 94, and the second organic insulating film 96 is provided on the insulating film 94 to cover the anode electrode 23. The mounting electrode 24 is coupled to the anode electrode 23 at the bottom surface of the first groove H1. This configuration reduces the number of layers of the array substrate 2 of the present embodiment as compared with the first embodiment. The configuration of the first groove H1 in plan view is the same as that illustrated in FIG. 6 according to the first embodiment. The first groove H1 according to the present embodiment, however, is formed not overlapping the anode electrodes 23 of the adjacent pixels 49 because the insulating film 95 is not provided. This configuration can secure electrical insulation between the mounting electrode 24 and the anode electrode 23 of the adjacent pixels 49.

Second Modification of Second Embodiment

Figure 9:
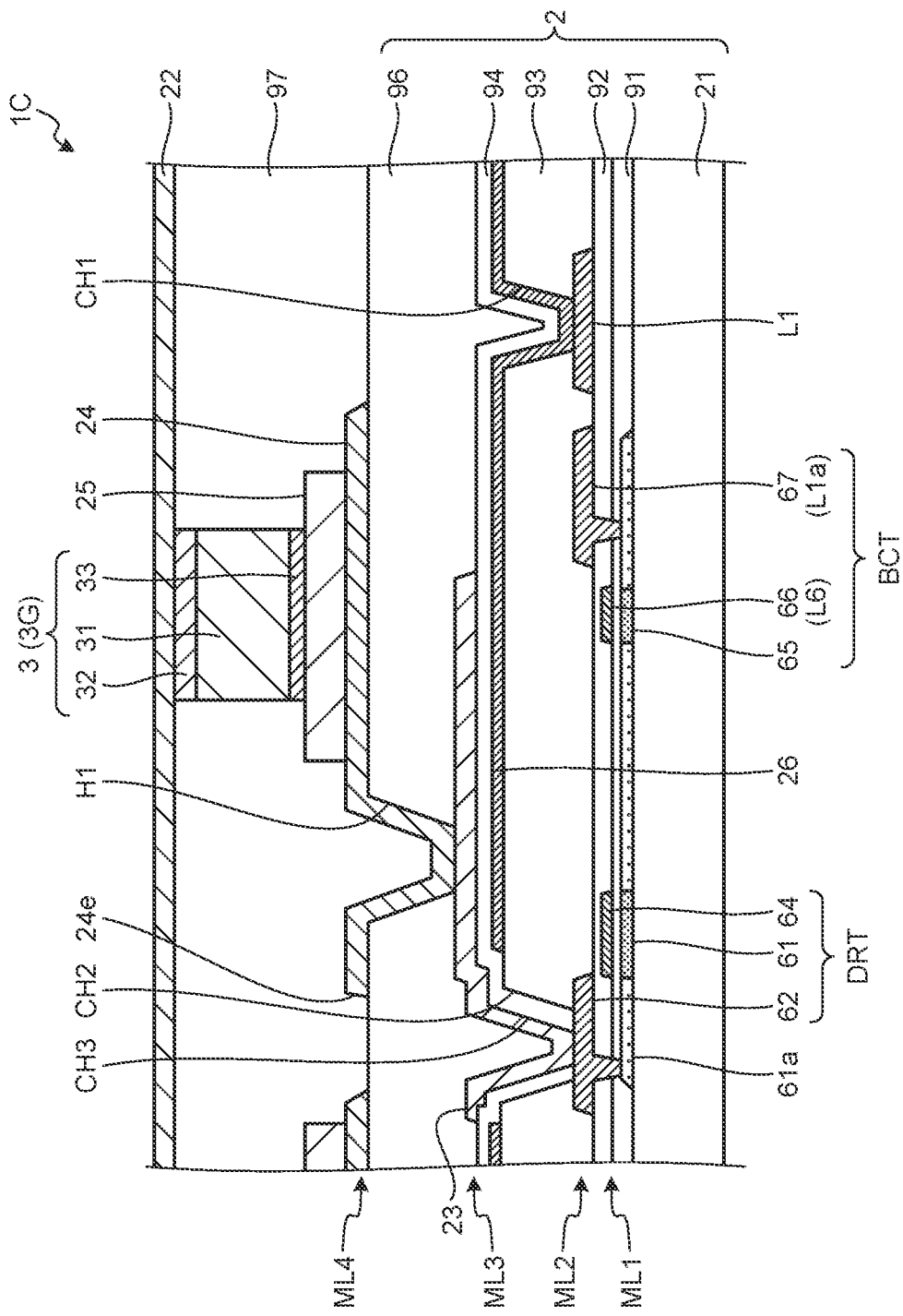
FIG. 9 is a sectional view schematically illustrating the display device according to a second modification of the second embodiment.
Figure 10:
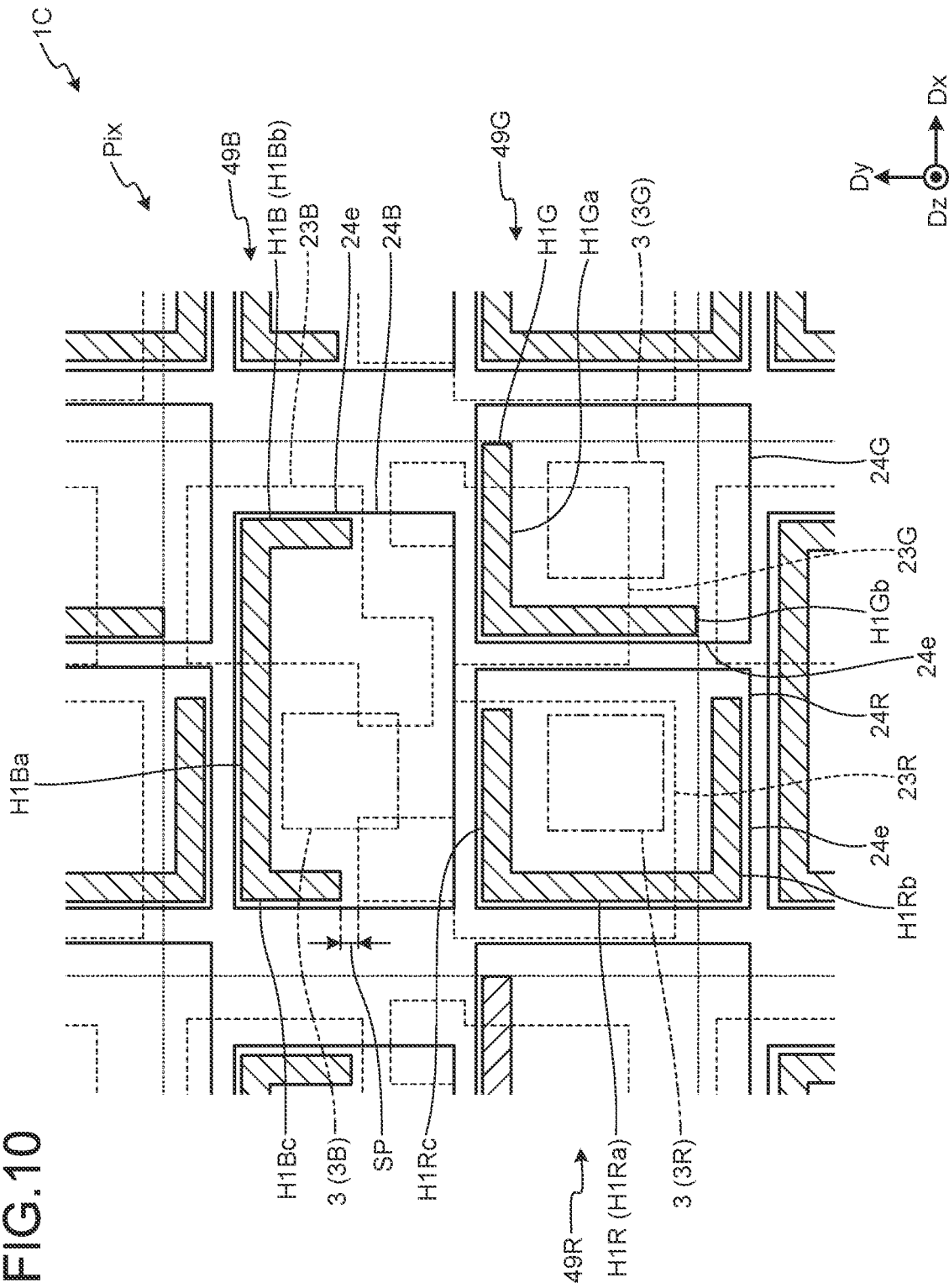
FIG. 10 is a plan view schematically illustrating the display device according to the second modification of the second embodiment.

FIG. 9 is a sectional view schematically illustrating the display device according to a second modification of the second embodiment. FIG. 10 is a plan view schematically illustrating the display device according to the second modification of the second embodiment. A display device 1C according to the second modification is different from the second embodiment in that the mounting electrode 24 is provided covering the first groove H1.

As illustrated in FIGS. 9 and 10, the outer periphery 24e of the mounting electrode 24 is provided outside the first groove H1 and at a position farther away from the light-emitting element 3 than the first groove H1. The outer periphery 24e of the mounting electrode 24 is provided on a flat region of the second organic insulating film 96. In other words, the first groove H1 is formed inside the region surrounded by the outer periphery 24e of the mounting electrode 24 in plan view. This configuration improves the coverability of the mounting electrode 24 in the first groove H1 and can restrain the anode electrode 23 from being exposed at the bottom surface of the first groove H1. Therefore, the second modification can restrain the anode electrode 23 from being damaged in the mounting process of the light-emitting element 3, for example.

The configuration according to the second modification can also be applied to the first embodiment and the first modification described above.

Third Modification of Second Embodiment

Figure 11:
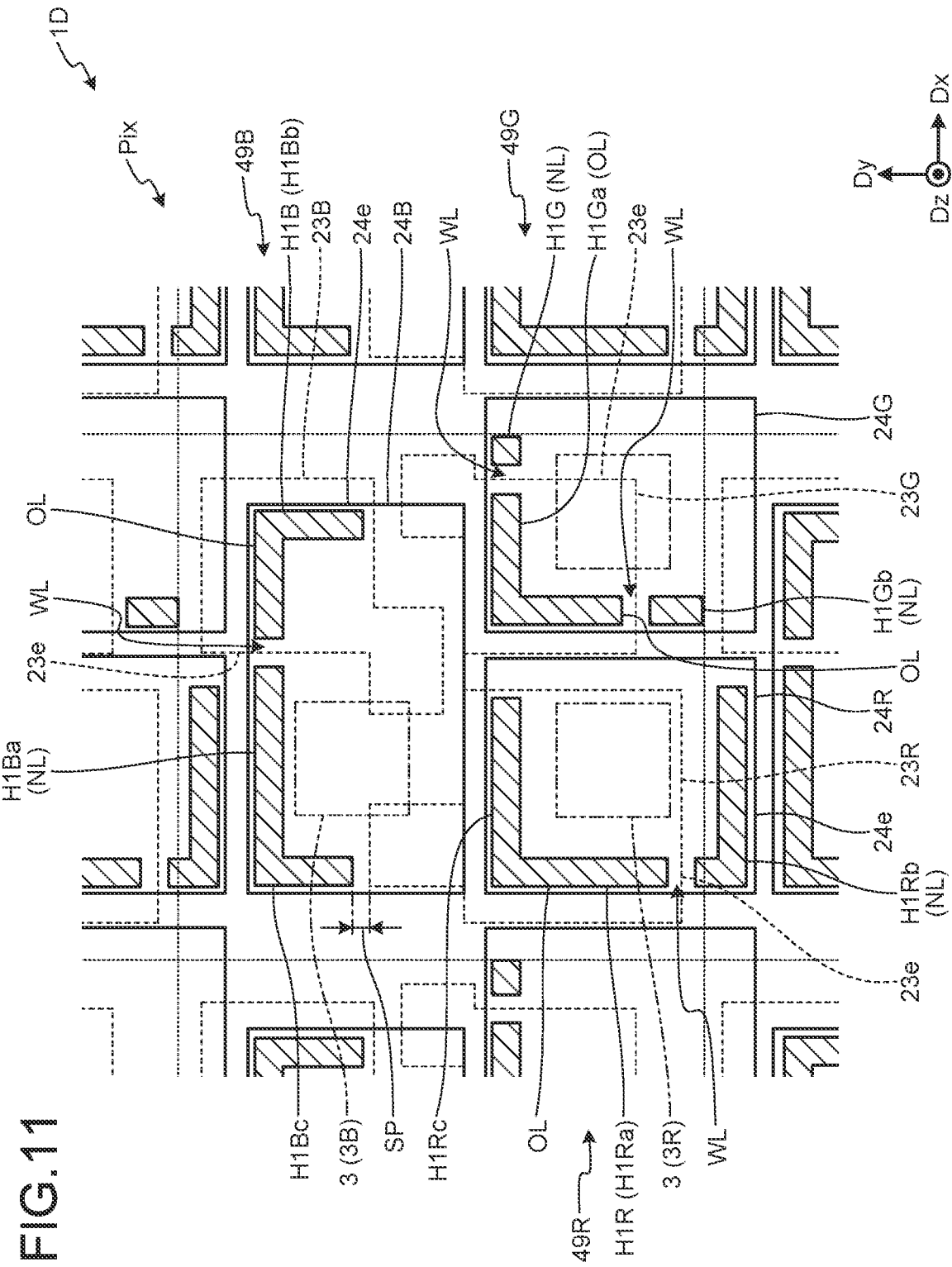
FIG. 11 is a plan view schematically illustrating the display device according to a third modification of the second embodiment.

FIG. 11 is a plan view schematically illustrating the display device according to a third modification of the second embodiment. A display device 1D according to the third modification is different from the embodiments and the modifications described above in that the first groove H1 is not formed at a part overlapping an outer periphery 23e of the anode electrode 23.

As illustrated in FIG. 11, in the first pixel 49R, the first extending part H1Ra of the first groove H1R has an overlapping part OL and a non-overlapping part NL. The overlapping part OL is a part overlapping the anode electrode 23R. The non-overlapping part NL is a part not overlapping the anode electrode 23R. The overlapping part OL and the non-overlapping part NL are formed apart from each other in the second direction Dy with the outer periphery 23e of the anode electrode 23R interposed therebetween in plan view. A wall WL of the second organic insulating film 96 is formed between the overlapping part OL and the non-overlapping part NL in the second direction Dy.

In the second pixel 49G, the first extending part H1Ga and the second extending part H1Gb of the first groove H1G each have the overlapping part OL and the non-overlapping part NL. The overlapping part OL of the first extending part H1Ga and the overlapping part OL of the second extending part H1Gb are coupled to form an L-shape. The overlapping part OL and the non-overlapping part NL of the first extending part H1Ga are formed apart from each other in the first direction Dx with the outer periphery 23e of the anode electrode 23G interposed therebetween. The overlapping part OL and the non-overlapping part NL of the second extending part H1Gb are formed apart from each other in the second direction Dy with the outer periphery 23e of the anode electrode 23G interposed therebetween.

In the third pixel 49B, the first extending part H1Ba of the first groove H1B has the overlapping part OL and the non-overlapping part NL. The overlapping part OL and the non-overlapping part NL of the first extending part H1Ba are formed apart from each other in the first direction Dx with the outer periphery 23e of the anode electrode 23B interposed therebetween.

The mounting electrode 24 is coupled to the anode electrode 23 at the bottom surface of the overlapping part OL in each pixel 49. The mounting electrode 24 is provided covering the inner wall and the bottom surface of the non-overlapping part NL (first groove H1). The mounting electrode 24 is coupled to the insulating film 94 (refer to FIG. 8) covering the counter electrode 26 at the bottom surface of the non-overlapping part NL. In other words, the overlapping part OL is a contact part for coupling the light-emitting element 3 to the drive transistor DRT and also serves as a structure for increasing the adhesion strength of the mounting electrode 24. By contrast, the non-overlapping part NL does not function as a contact part and serves as a structure for increasing the adhesion strength of the outer periphery 24e of the mounting electrode 24 at a part of the mounting electrode 24 along the outer periphery 24e on which no contact part is formed.

By forming the overlapping part OL apart from the non-overlapping part NL, the wall WL is provided covering the step formed by the outer periphery 23e of the anode electrode 23. In other words, the mounting electrode 24 is not provided directly on the step formed by the outer periphery 23e of the anode electrode 23. This configuration can restrain the mounting electrode 24 from peeling off due to the step formed by the outer periphery 23e of the anode electrode 23.

The configuration according to the third modification can also be applied to the first embodiment and the first modification described above. The mounting electrode 24 according to the third modification is provided covering the entire region of the first groove H1 (the overlapping part OL and the non-overlapping part NL). The present modification is not limited thereto, and the configuration according to the third modification can be combined with the configuration according to the second embodiment described above. The outer periphery 24e of the mounting electrode 24, for example, may be provided overlapping the inner wall of the overlapping part OL or the non-overlapping part NL.

Third Embodiment

Figure 12:
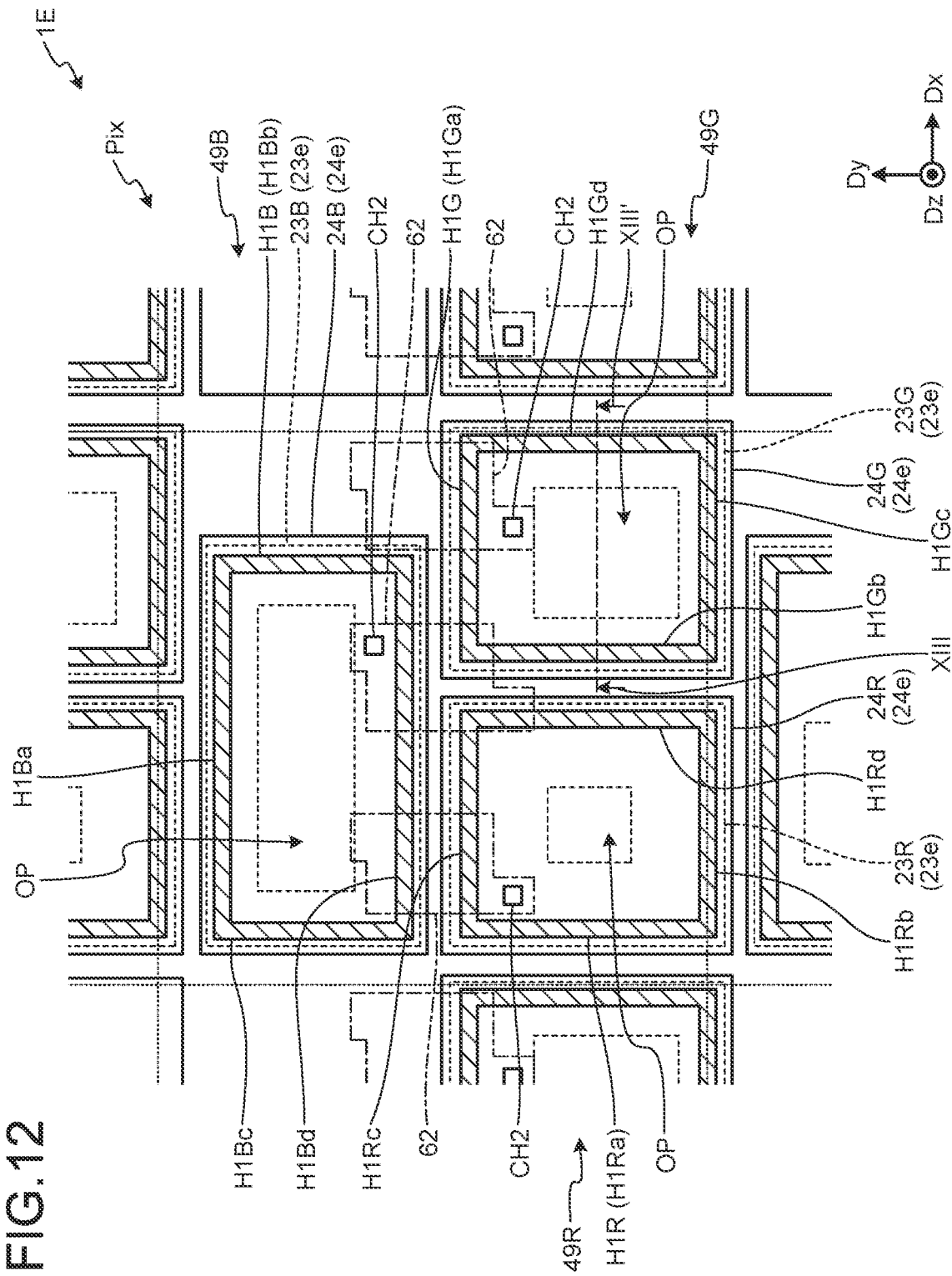
FIG. 12 is a plan view schematically illustrating the display device according to a third embodiment.
Figure 13:
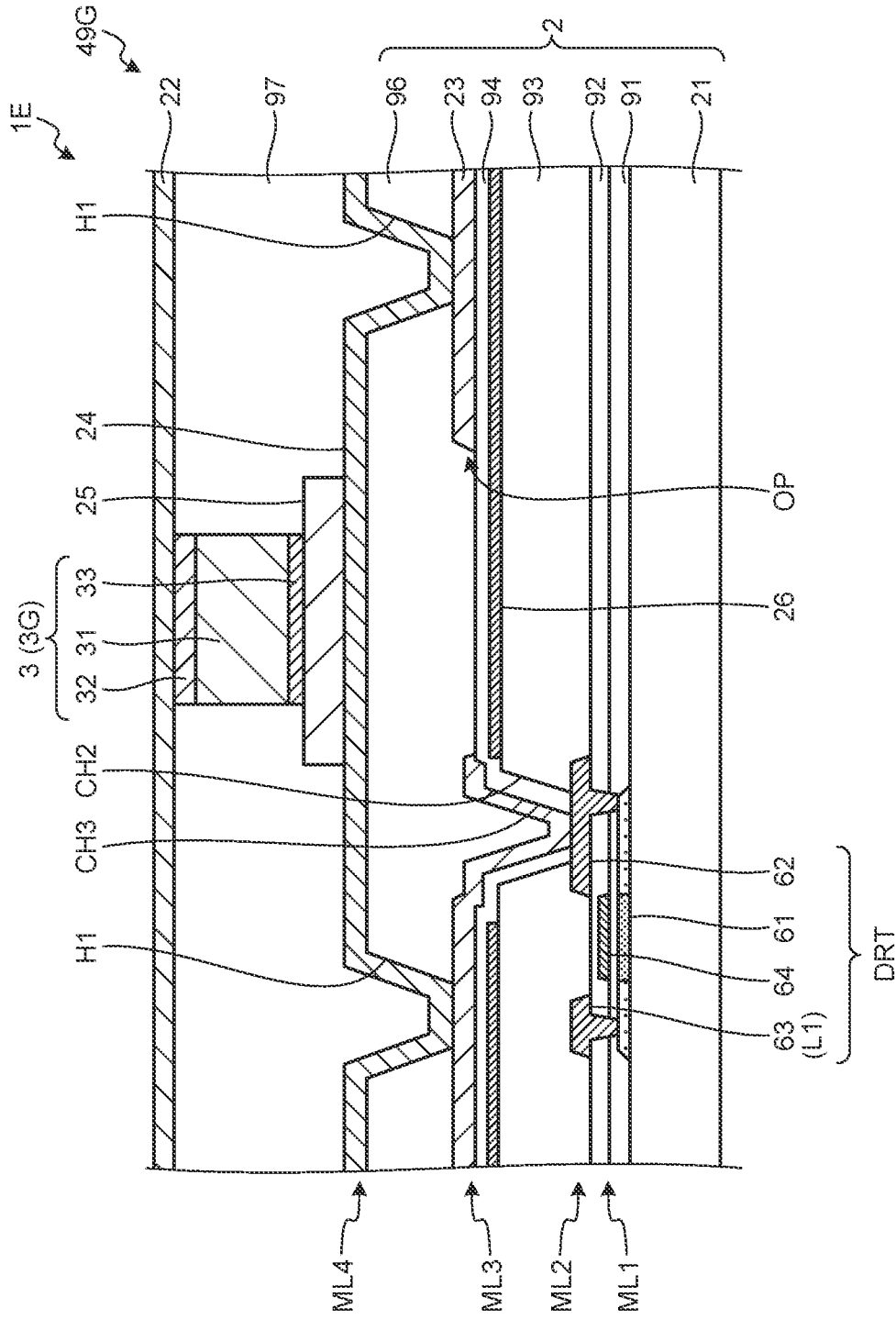
FIG. 13 is a sectional view schematically illustrating the display device according to the third embodiment.

FIG. 12 is a plan view schematically illustrating the display device according to a third embodiment. FIG. 13 is a sectional view schematically illustrating the display device according to the third embodiment. FIG. 13 is a sectional view along line XIII-XIII' of FIG. 12. A display device 1E according to the third embodiment is different from the embodiments and the modifications described above in that each of the anode electrode 23 and the mounting electrode 24 has a quadrilateral outer shape and that the mounting electrode 24 is provided covering the entire anode electrode 23.

As illustrated in FIG. 12, the mounting electrode 24 has the same outer shape as that of the anode electrode 23 and is provided overlapping the anode electrode 23. In other words, the outer periphery 24e of the mounting electrode 24 matches the outer periphery 23e of the anode electrode 23. In FIG. 12, the mounting electrode 24 is illustrated larger than the anode electrode 23 to illustrate both the mounting electrode 24 and the anode electrode 23. In the present specification, the "same outer shape" is not limited to a case where the outer shapes in plan view are exactly the same and includes a case where they are substantially the same. The mounting electrode 24 and the anode electrode 23, for example, may have errors or misalignment caused in the manufacturing process.

In a similar manner to the first modification, the first groove H1 is formed into an annular shape along the outer periphery 24e of the mounting electrode 24. All the extending parts forming the first groove H1, however, overlap the anode electrode 23. In other words, the mounting electrode 24 is coupled to the anode electrode 23 at the bottom surface of the first groove H1 in an annular shape along the four sides of the outer periphery 24e. With this configuration, the present embodiment can secure electrical coupling between the mounting electrode 24 and the anode electrode 23.

As illustrated in FIG. 13, the light-emitting element 3 is disposed between two first grooves H1 in sectional view. The mounting electrode 24 is coupled to the anode electrode 23 at the bottom surfaces of the two first grooves H1. With this configuration, the present embodiment can secure the flatness of the region on which the light-emitting element 3 is mounted and increase the adhesion strength on the outer periphery 24e of the mounting electrode 24.

As illustrated in FIG. 12, the anode electrodes 23 each have an opening OP at the center. Each opening OP is formed at a position not overlapping the first groove H1 in a region surrounded by the first groove H1. As illustrated in FIG. 13, the opening OP is formed between the two first grooves H1. The second organic insulating film 96 is in contact with the insulating film 94 in the opening OP. This configuration can appropriately adjust the capacitance value of the second capacitor Cs2 formed between the anode electrode 23 and the counter electrode 26, if the anode electrode 23 and the mounting electrode 24 have the same outer shape.

The source electrodes 62 provided corresponding to the respective pixels 49 are arranged in the first direction Dx. In the source electrodes 62 arranged in the first direction Dx, the positions of the contact holes CH2 in the second direction Dy are disposed in a staggered manner. This configuration can secure coupling to the drive transistor DRT, if the outer shape of the anode electrode 23 is formed into a quadrilateral shape to match the outer shape of the mounting electrode 24. In other words, the transistors formed on the substrate 21, the source electrode 62 formed with the second metal layer ML2, and other components can have a configuration in common with the configuration of the first embodiment, the second embodiment, and the like.

The anode electrode 23 according to the present embodiment is formed into an annular shape surrounding the opening OP. The configuration is not limited thereto, and the anode electrode 23 may have an L- or C-shape. The anode electrode 23 may be formed into an L-shape by forming the outer shape of the anode electrode 23 into a quadrilateral to match the outer shape of the mounting electrode 24 and forming the opening OP (cut-out) so as to cut out one corner of the anode electrode 23.

Alternatively, the anode electrode 23 may be formed into a C-shape by forming the opening OP so as to cut out one side of the anode electrode 23.

Fourth Embodiment

Figure 14:
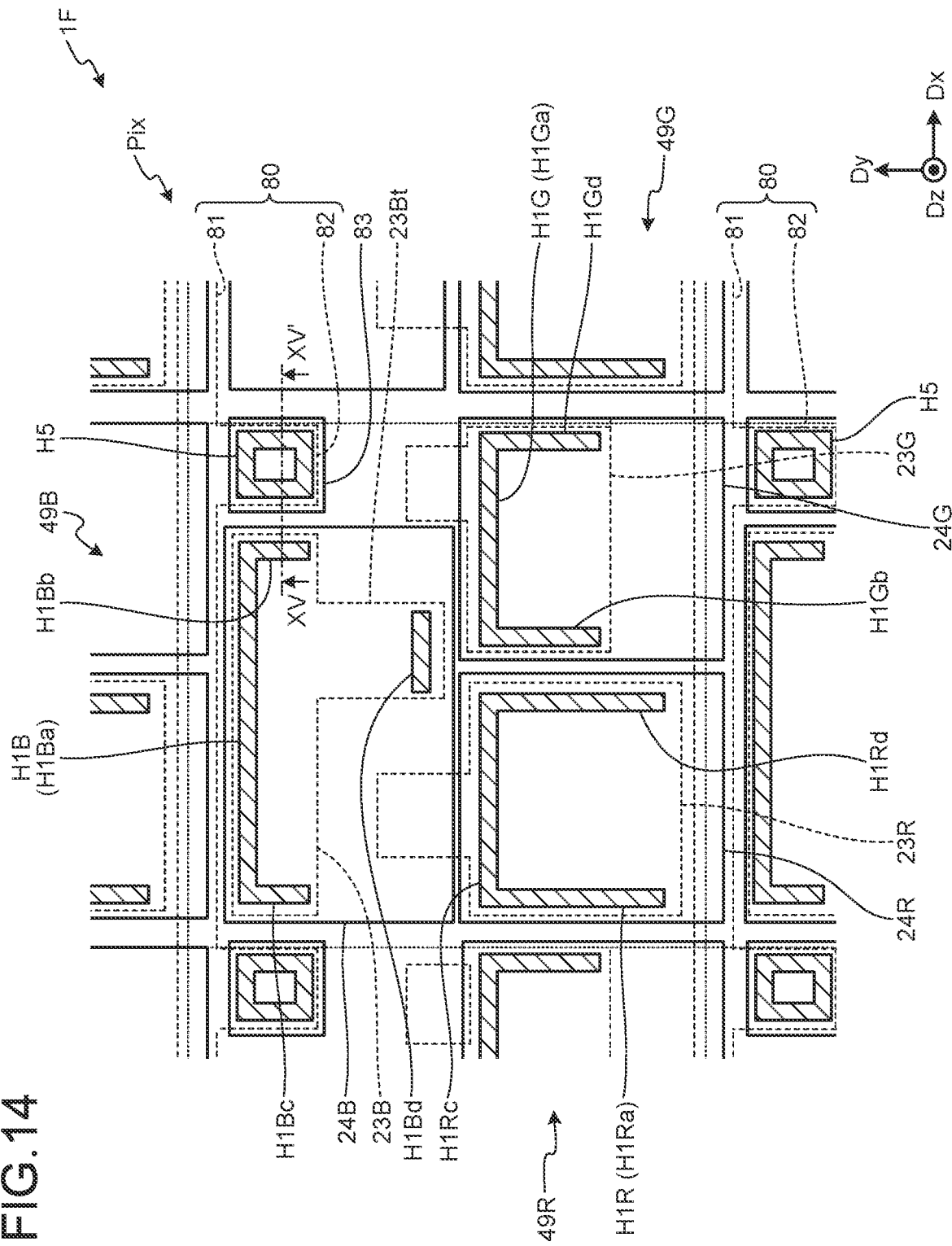
FIG. 14 is a plan view schematically illustrating the display device according to a fourth embodiment.
Figure 15:
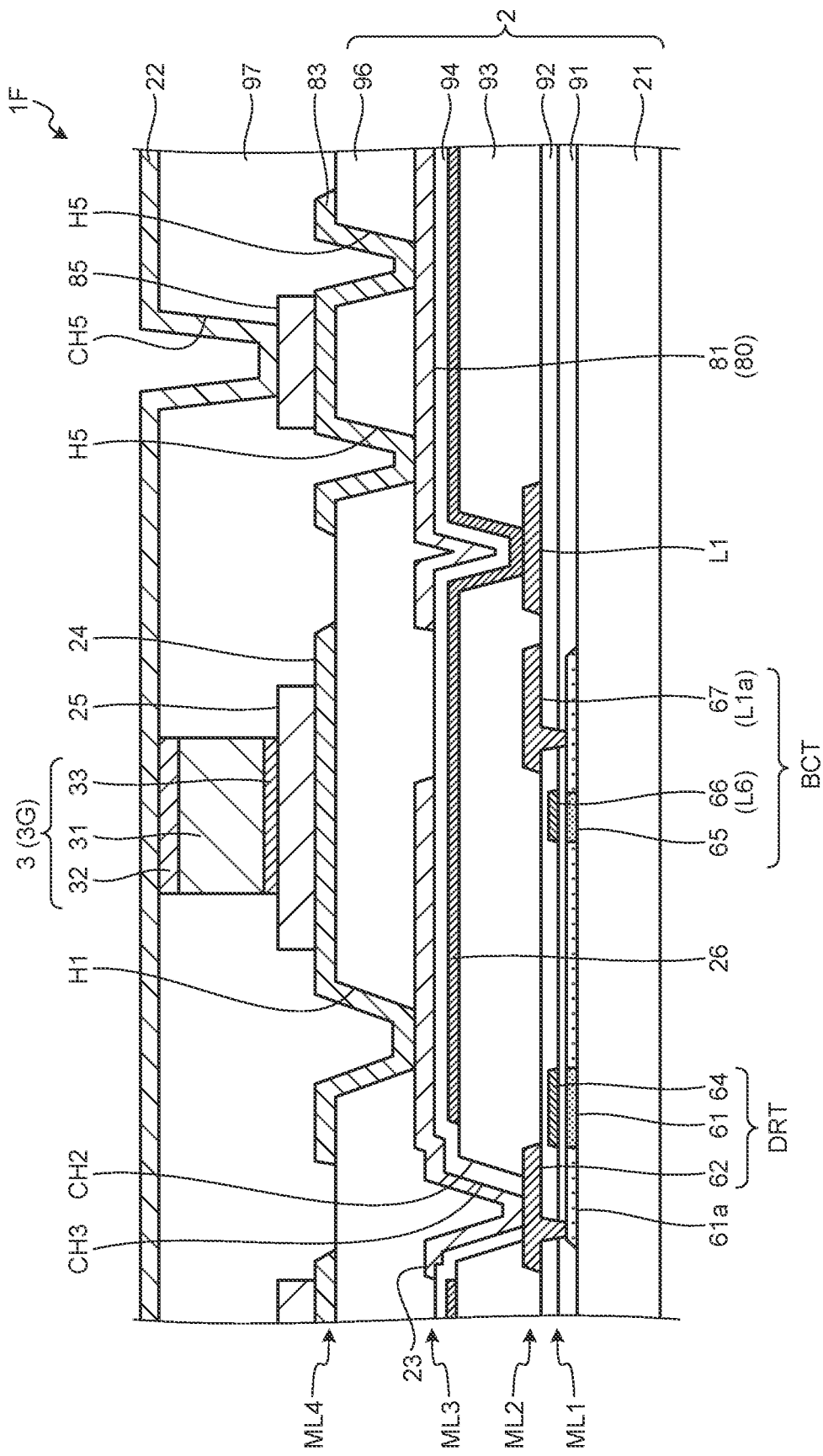
FIG. 15 is a sectional view schematically illustrating the display device according to the fourth embodiment.

FIG. 14 is a plan view schematically illustrating the display device according to a fourth embodiment. FIG. 15 is a sectional view schematically illustrating the display device according to the fourth embodiment. FIG. 15 is a sectional view along line XV-XV' of FIG. 14. A display device 1F according to the fourth embodiment is different from the embodiments and the modifications described above in that pixel cathode wiring 80 is provided to the array substrate 2.

As illustrated in FIG. 14, the pixel cathode wiring 80 extends in the first direction Dx and is provided over the pixels Pix arrayed in the first direction Dx. A plurality of pieces of the pixel cathode wiring 80 are arrayed in the second direction Dy and are provided for the respective pixels Pix arrayed in the second direction Dy. The pixel cathode wiring 80 is wiring that electrically couples the cathodes (cathode terminals 32) of the light-emitting elements 3 on a row-by-row basis.

The pixel cathode wiring 80 includes a wiring part 81 and a coupling part 82. The wiring part 81 extends in the first direction Dx and is provided over the pixels Pix. The coupling part 82 is provided to each of the pixels Pix arrayed in the first direction Dx and protrudes from the wiring part 81 in the second direction Dy.

The wiring part 81 is disposed between the pixels Pix adjacently disposed in the second direction Dy. Specifically, the wiring part 81 is disposed between the anode electrode 23B of one pixel Pix and the anode electrodes 23R and 23G of the other pixel Pix in the second direction Dy. The coupling part 82 is disposed between the pixels Pix adjacently disposed in the first direction Dx. Specifically, the coupling part 82 is disposed between the anode electrode 23B of one pixel Pix and the anode electrode 23B of the other pixel Pix in the first direction Dx.

A relay electrode 83 is an electrode that electrically couples the pixel cathode wiring 80 to the cathode (cathode terminal 32) of the light-emitting element 3.

Specifically, the relay electrode 83 is provided on the second organic insulating film 96 (refer to FIG. 15) and overlaps the coupling part 82 of the pixel cathode wiring 80. The relay electrode 83 has a quadrilateral outer shape substantially the same as that of the coupling part 82. The relay electrode 83 according to the present embodiment is disposed between the mounting electrodes 24B of pixels Pix adjacently disposed in the first direction Dx.

A third groove H5 has an annular shape in plan view and is formed in a region overlapping the relay electrode 83. The third groove H5 is formed along the four sides of the outer periphery of the relay electrode 83. The configuration is not limited thereto, and the third groove H5 simply needs to be formed along at least one side of the outer periphery of the relay electrode 83. In other words, the third groove H5 may be composed of one extending part formed along one side of the outer periphery of the relay electrode 83 in plan view. Alternatively, the third groove H5 may have an L-shape along two sides or a C-shape along three sides. With the third groove H5, the present embodiment secures coupling between the pixel cathode wiring 80 (coupling part 82) and the relay electrode 83 and can restrain the outer periphery of the relay electrode 83 from peeling off.

As illustrated in FIG. 15, the pixel cathode wiring 80 (the wiring part 81 and the coupling part 82) is provided between the first organic insulating film 93 and the second organic insulating film 96. More specifically, the pixel cathode wiring 80 is formed with the third metal layer ML3 and is provided in the same layer as that of the anode electrode 23 on the insulating film 94. This configuration can reduce the resistance of the pixel cathode wiring 80 as compared with the cathode electrode 22 made of light-transmitting conductive material, such as ITO, and reduce the resistance of the cathodes of the light-emitting elements 3.

The relay electrode 83 is formed with the fourth metal layer ML4 and is provided in the same layer as that of the mounting electrode 24 on the second organic insulating film 96. The relay electrode 83 is provided covering the third groove H5 and is coupled to the coupling part 82 at the bottom surface of the third groove H5. The outer periphery of the relay electrode 83 is positioned outside the third groove H5 and on the second organic insulating film 96. The configuration is not limited thereto, and the outer periphery of the relay electrode 83 may be provided at a position overlapping the inner wall of the third groove H5.

A contact hole CH5 is formed in a region overlapping the relay electrode 83 in the element insulating film 97. The cathode electrode 22 is coupled to a bonding member 85 at the bottom surface of the contact hole CH5 and is electrically coupled to the relay electrode 83. The bonding member 85 is made of the same material as that of the bonding member 25 provided to the light-emitting element 3. The bonding member 85 is not necessarily provided, and the cathode electrode 22 may be directly coupled to the relay electrode 83.

With this configuration, the light-emitting element 3 is electrically coupled to the pixel cathode wiring 80 via the relay electrode 83. The pixel cathode wiring 80 is provided to the inner layer of the array substrate 2 and is electrically coupled to the light-emitting elements 3 on a row-by-row basis. With this configuration, the pixel cathode wiring 80 can maintain electrical coupling between the cathodes of the light-emitting elements 3, if a part of the cathode electrode 22 provided on the surface layer is broken.

Referring back to FIG. 14, each of the anode electrode 23R and the mounting electrode 24R in the first pixel 49R has a quadrilateral shape. The mounting electrode 24R overlaps the anode electrode 23R, and the outer periphery 24e in the second direction Dy overlaps the wiring part 81. The first groove H1R has the first extending part H1Ra, the third extending part H1Rc, and the fourth extending part H1Rd formed along three sides of the outer periphery 24e of the mounting electrode 24R.

In the second pixel 49G, each of the anode electrode 23G and the mounting electrode 24G has a quadrilateral shape. The area (length in the second direction Dy) of the anode electrode 23G is smaller (shorter) than that of the anode electrode 23R. The mounting electrode 24G overlaps the anode electrode 23G, and the outer periphery 24e in the second direction Dy overlaps the wiring part 81. The first groove H1G has the first extending part H1Ga, the second extending part H1Gb, and the fourth extending part H1Gd formed along three sides of the outer periphery 24e of the mounting electrode 24G.

In the third pixel 49B, the anode electrode 23B has a rectangular shape extending in the first direction Dx. The anode electrode 23B is provided with a coupling electrode 23Bt for coupling the anode electrode 23B to the drive transistor DRT. The coupling electrode 23Bt has a rectangular shape extending in the second direction Dy. The mounting electrode 24B has a quadrilateral shape and overlaps the anode electrode 23B and the coupling electrode 23Bt. The first groove H1B has the first extending part H1Ba, the second extending part H1Bb, and the third extending part H1Bc formed along three sides of the outer periphery 24e of the mounting electrode 24B. The fourth extending part H1Bd is formed at a position overlapping the end of the coupling electrode 23Bt in the second direction Dy.

With this configuration, even if the pixel cathode wiring 80 is provided, the anode electrodes 23 and the mounting electrodes 24 can be efficiently disposed to secure the area of the mounting electrodes 24R, 24G, and 24B, and the mounting electrodes 24R, 24G, and 24B can be restrained from peeling off.

The configuration of the anode electrodes 23, the mounting electrodes 24, the first grooves H1, and other components of each pixel 49 illustrated in FIG. 14 is given by way of example only and can be appropriately modified. The pixel cathode wiring 80, for example, may be provided to the first to the third embodiments and the modifications described above.

Fourth Modification of Fourth Embodiment

Figure 16:
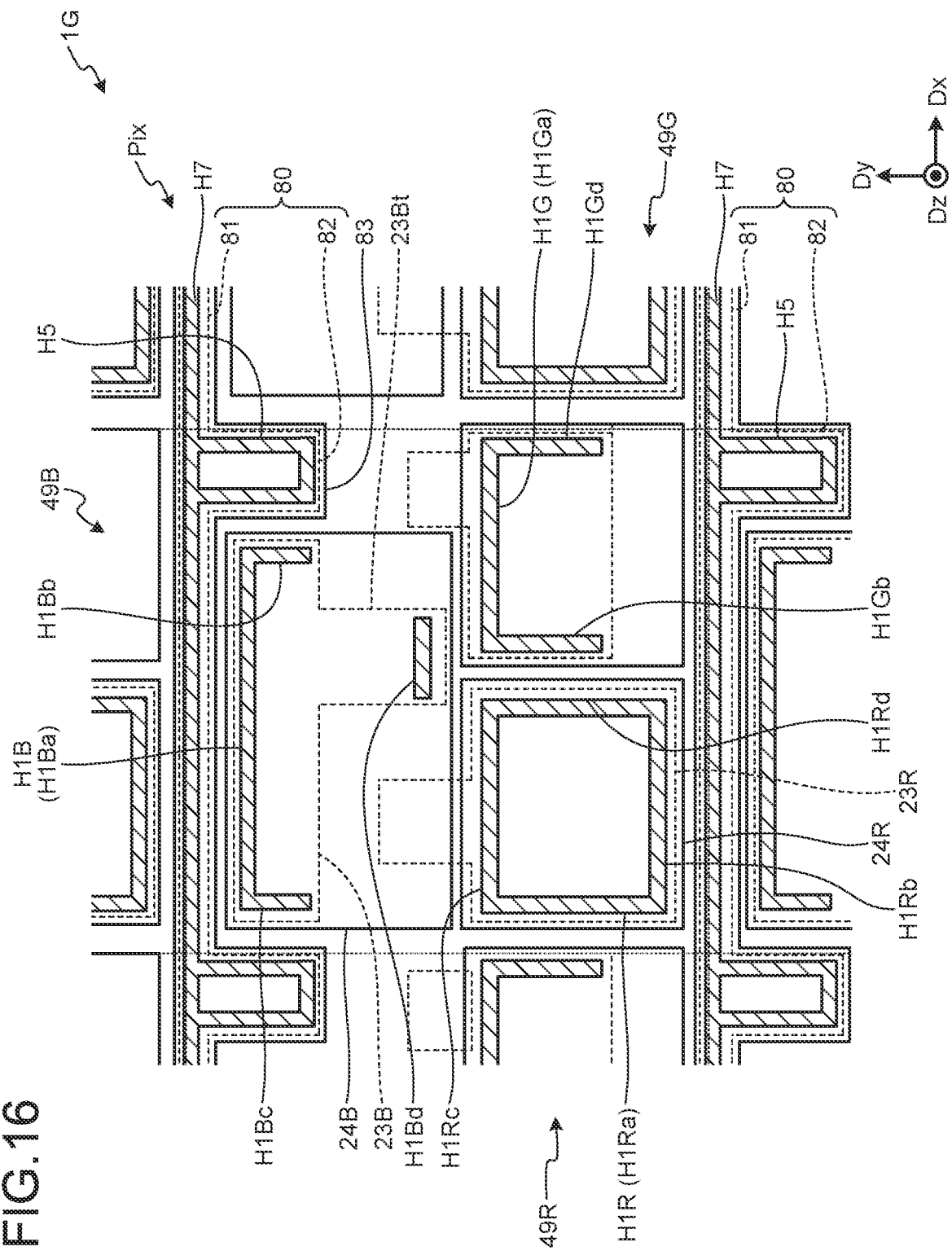
FIG. 16 is a plan view schematically illustrating the display device according to a fourth modification of the fourth embodiment.

FIG. 16 is a plan view schematically illustrating the display device according to a fourth modification of the fourth embodiment. A display device 1G according to the fourth modification is different from the fourth embodiment in that the relay electrode 83 is provided overlapping the wiring part 81 and the coupling part 82 of the pixel cathode wiring 80.

The relay electrode 83 has the same outer shape as that of the pixel cathode wiring 80 in plan view and extends in the first direction Dx as a whole. The outer periphery of the relay electrode 83 matches the outer periphery of the pixel cathode wiring 80 in plan view. In FIG. 16, the relay electrode 83 is illustrated larger than the pixel cathode wiring 80 to illustrate both the pixel cathode wiring 80 and the relay electrode 83. The third groove H5 is formed along the outer periphery of the coupling part 82. Alternatively, the third groove H5 is formed along the outer periphery of a part of the relay electrode 83 overlapping the coupling part 82.

The second organic insulating film 96 (refer to FIG. 15) has a fourth groove H7 extending along the wiring part 81 in plan view. Alternatively, the fourth groove H7 is formed along a part of the relay electrode 83 overlapping the wiring part 81. With this configuration, the relay electrode 83 is coupled to the coupling part 82 at the bottom surface of the third groove H5 and to the wiring part 81 at the bottom surface of the fourth groove H7. The fourth groove H7 is connected to the third groove H5. The configuration is not limited thereto, and the fourth groove H7 may be formed apart from the third groove H5.

In the present modification, the relay electrode 83 also electrically couples the cathodes of the light-emitting elements 3 on a row-by-row basis in a similar manner to the pixel cathode wiring 80. Therefore, the present modification can reduce the resistance between the cathodes of the light-emitting elements 3.

Fifth Modification of Fourth Embodiment

Figure 17:
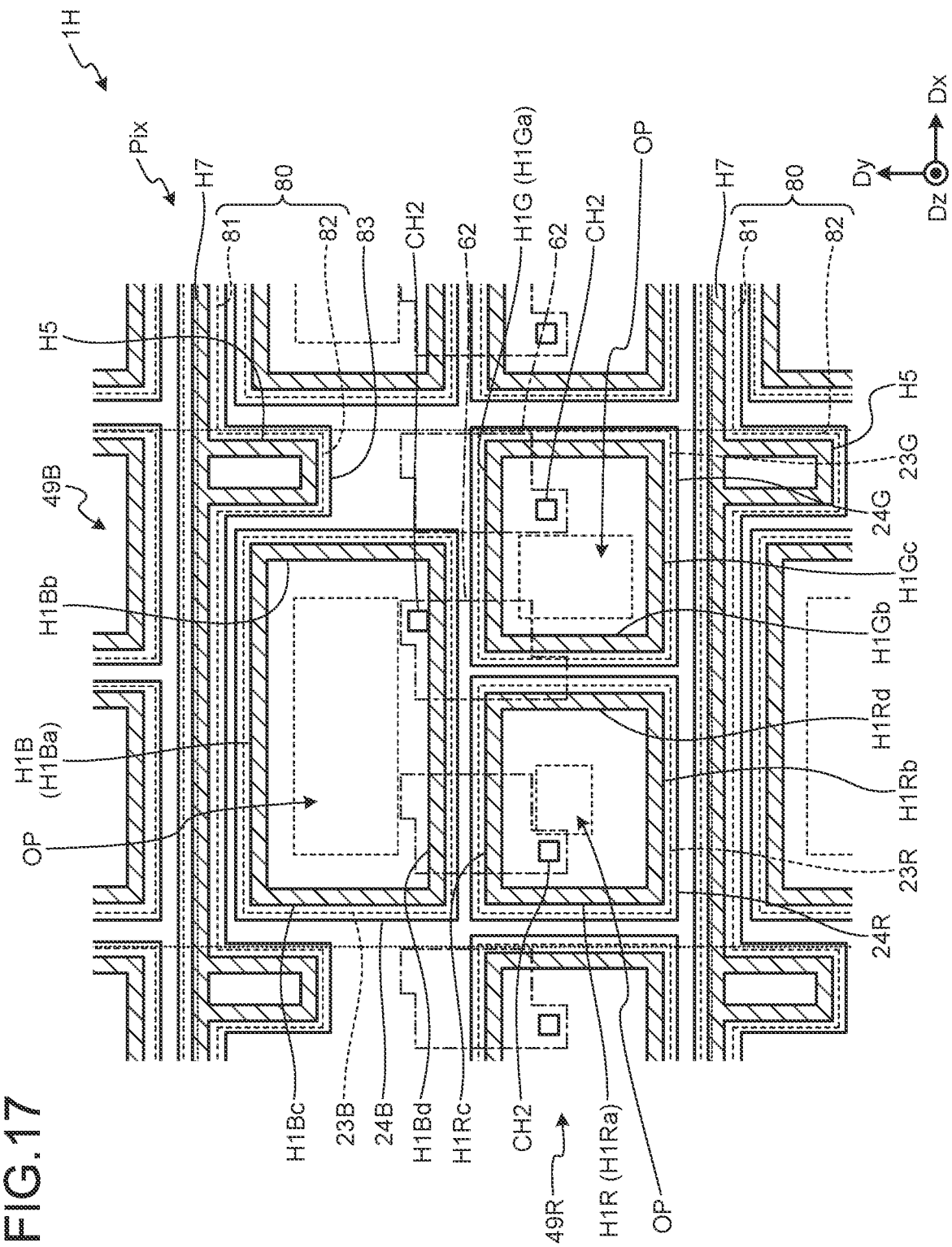
FIG. 17 is a plan view schematically illustrating the display device according to a fifth modification of the fourth embodiment.

FIG. 17 is a plan view schematically illustrating the display device according to a fifth modification of the fourth embodiment. A display device 1H according to the fifth modification is obtained by combining the configuration of the relay electrodes 83 and the pixel cathode wiring 80 according to the fourth modification with the configuration of the anode electrodes 23, the mounting electrodes 24, and the first grooves H1 of the display device 1E (refer to FIG. 12) according to the third embodiment described above.

In other words, as illustrated in FIG. 17, the anode electrode 23 and the mounting electrode 24 have a quadrilateral outer shape and overlap each other, and the anode electrode 23 has the opening OP. The first grooves H1 are each formed in an annular shape along the four sides of the mounting electrode 24. The pixel cathode wiring 80 and the relay electrode 83 are provided in a region not overlapping the anode electrodes 23 or the mounting electrodes 24 of each pixel 49.

The present modification enables efficiently disposing the anode electrodes 23, the mounting electrodes 24, and the first grooves H1 of the pixels 49, if the pixel cathode wiring 80 and the relay electrodes 83 are provided.

Sixth Modification of Fourth Embodiment

Figure 18:
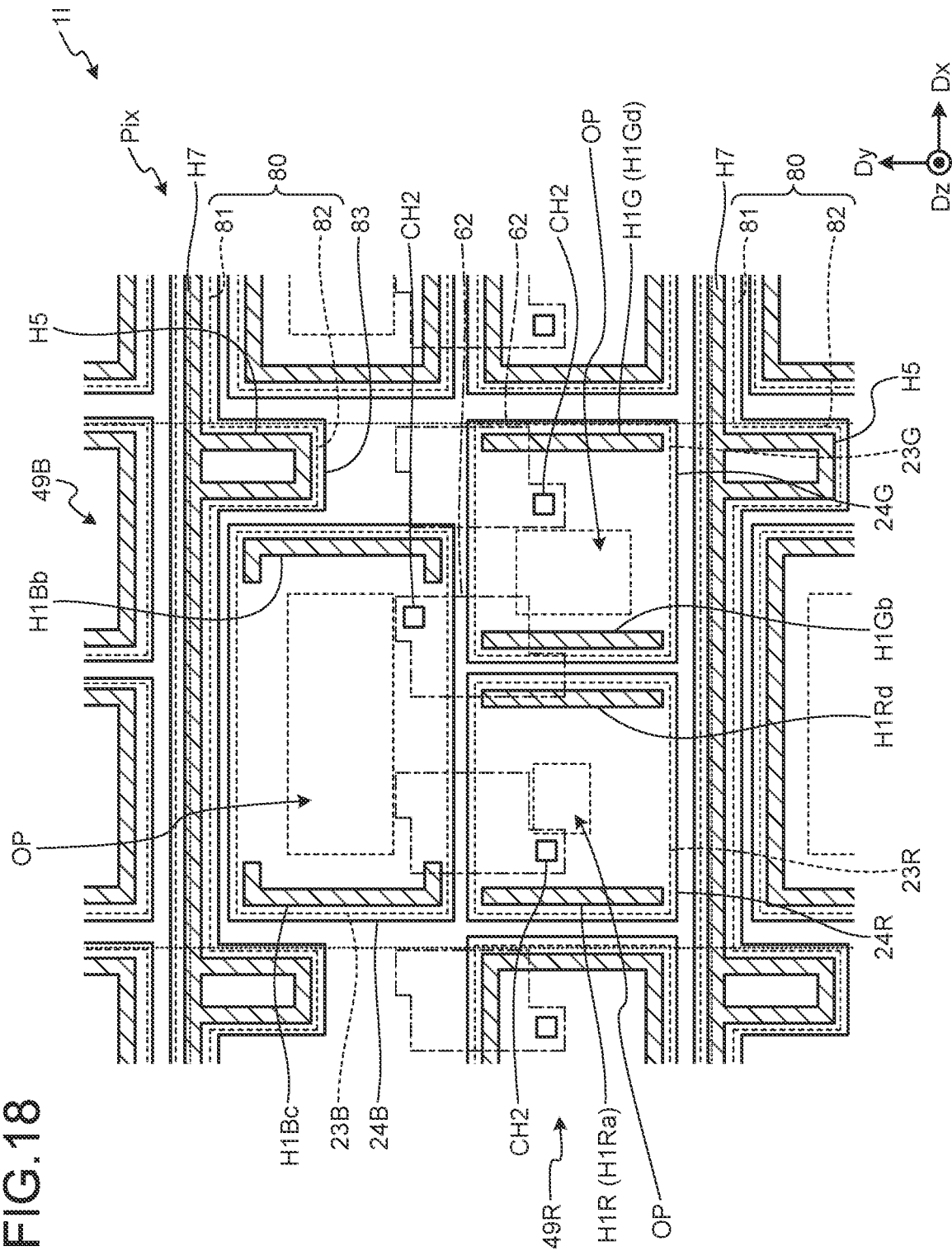
FIG. 18 is a plan view schematically illustrating the display device according to a sixth modification of the fourth embodiment.

FIG. 18 is a plan view schematically illustrating the display device according to a sixth modification of the fourth embodiment. A display device 1I according to the sixth modification is different from the display device 1H according to the fifth modification in that part of the annular first groove H1 is not formed.

As illustrated in FIG. 18, the first grooves H1 are formed along two sides of the outer periphery of the mounting electrode 24 extending in the second direction Dy in each pixel 49. Two first grooves H1 are formed in each pixel 49. The two first grooves H1 are formed apart from each other in the first direction Dx and extend in the second direction Dy. The first groove H1 is not formed on the two sides of the outer periphery of the mounting electrode 24 extending in the first direction Dx, and the second organic insulating film 96 is formed flat.

The present modification can restrain the mounting electrode 24 from peeling off by virtue of the first grooves H1 and increase the area of the flat region of the mounting electrode 24. Therefore, the display device 1I enables the mounting electrode 24 to be mounted on the light-emitting element 3 to achieve higher definition of display.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modification thereof.

What is claimed is:
1. A display device comprising:
   a substrate;
   a plurality of pixels provided to the substrate;
   a light-emitting element and a transistor provided to each of the pixels;
   an insulating film covering the transistor;
   a mounting electrode provided on the insulating film and on which the light-emitting element is mounted; and
   an anode electrode facing at least a part of the mounting electrode and electrically coupled to the transistor, wherein
   the insulating film has a first groove extending along at least one side of an outer periphery of the mounting electrode in plan view seen from a direction perpendicular to the substrate, and
   the mounting electrode is coupled to the anode electrode in a linear part along an extending direction of the first groove at a bottom surface of the first groove.

2. The display device according to claim 1, wherein the first groove, in plan view, has:
   a first extending part extending in a first direction; and
   a second extending part extending in a second direction intersecting the first direction.

3. The display device according to claim 1, wherein the first groove is formed into an annular shape along the outer periphery of the mounting electrode.

4. The display device according to claim 1, wherein the insulating film comprises:
   a first organic insulating film provided on the transistor; and
   a second organic insulating film stacked on the first organic insulating film,
   the anode electrode is provided between the first organic insulating film and the second organic insulating film,
   the first groove is formed in the second organic insulating film, and
   the mounting electrode is provided on the second organic insulating film.

5. The display device according to claim 4, further comprising:
   an inorganic insulating film provided between the first organic insulating film and the second organic insulating film and covering the anode electrode, wherein
   the inorganic insulating film has a second groove overlapping the first groove and extending in the same direction as the extending direction of the first groove, and
   the mounting electrode is coupled to the anode electrode at bottom surfaces of the first groove and the second groove.

6. The display device according to claim 5, wherein the second groove is formed at a position overlapping the anode electrode and is not formed in a region of the inorganic insulating film not overlapping the anode electrode.

7. The display device according to claim 1, wherein the first groove is composed of a part overlapping the anode electrode and a part not overlapping the anode electrode that are continuously formed.

8. The display device according to claim 1, wherein the first groove has an overlapping part overlapping the anode electrode and a non-overlapping part not overlapping the anode electrode, and
   the overlapping part and the non-overlapping part are formed apart from each other with an outer periphery of the anode electrode interposed between the overlapping part and the non-overlapping part in plan view.

9. The display device according to claim 1, wherein the mounting electrode has the same outer shape as the outer shape of the anode electrode and is provided overlapping the anode electrode, and
   the anode electrode has an opening at a position not overlapping the first groove.

10. The display device according to claim 1, wherein the outer periphery of the mounting electrode is provided overlapping an inner wall of the first groove.

11. The display device according to claim 1, further comprising:
   pixel cathode wiring comprising a wiring part extending over a plurality of the pixels and a coupling part provided for each of the pixels and protruding from the wiring part; and
   a relay electrode provided on the insulating film, overlapping at least a part of the pixel cathode wiring, and configured to electrically couple the pixel cathode wiring to a cathode of the light-emitting element, wherein
   the insulating film has a third groove extending along at least one side of an outer periphery of the relay electrode in plan view.

12. The display device according to claim 11, wherein the relay electrode is provided overlapping the wiring part and the coupling part,
   the third groove is formed along an outer periphery of the coupling part, and
   the insulating film has a fourth groove extending along the wiring part in plan view.

13. A display device comprising:
   a substrate;
   a plurality of pixels provided to the substrate;
   a light-emitting element and a transistor provided to each of the pixels;
   an insulating film covering the transistor;
   a mounting electrode provided on the insulating film and on which the light-emitting element is mounted; and
   an anode electrode facing at least a part of the mounting electrode and electrically coupled to the transistor, wherein
   the insulating film has a first groove formed in a region not overlapping the anode electrode and extending along at least one side of an outer periphery of the mounting electrode in plan view seen from a direction perpendicular to the substrate, and
   the mounting electrode covers an inner wall and a bottom surface of the first groove.

* * * * *